(12) United States Patent
Su et al.

(10) Patent No.: US 11,772,300 B2
(45) Date of Patent: Oct. 3, 2023

(54) BLADE HOLDING JIG

(71) Applicant: DISCO CORPORATION, Tokyo (JP)

(72) Inventors: Zhibo Su, Tokyo (JP); Kazuki Terada, Tokyo (JP); Kenichi Fujie, Tokyo (JP)

(73) Assignee: DISCO CORPORATION, Tokyo (JP)

(*) Notice: Subject to any disclaimer, the term of this patent is extended or adjusted under 35 U.S.C. 154(b) by 311 days.

(21) Appl. No.: 17/211,224

(22) Filed: Mar. 24, 2021

(65) Prior Publication Data

US 2021/0316477 A1 Oct. 14, 2021

(30) Foreign Application Priority Data

Apr. 10, 2020 (JP) .................. 2020-070793

(51) Int. Cl.
*B28D 5/02* (2006.01)
*B23B 31/30* (2006.01)
*B23Q 3/155* (2006.01)
*H01L 21/67* (2006.01)

(52) U.S. Cl.
CPC ............ *B28D 5/022* (2013.01); *B23B 31/307* (2013.01); *B23Q 3/1554* (2013.01); *H01L 21/67092* (2013.01)

(58) Field of Classification Search
CPC .... B28D 5/022; B23B 31/307; B23Q 3/1554; B23Q 3/1552; H01L 21/67092; B26D 7/2621; B24B 45/006
USPC ........................................................ 30/124
See application file for complete search history.

(56) References Cited

U.S. PATENT DOCUMENTS

| 2015/0020666 | A1* | 1/2015 | Wakita | B23B 31/307 |
| | | | | 83/401 |
| 2015/0020670 | A1* | 1/2015 | Wakita | B27B 5/325 |
| | | | | 83/698.41 |
| 2016/0207216 | A1* | 7/2016 | Nitta | B28D 5/022 |
| 2019/0001526 | A1* | 1/2019 | Sekiya | B28D 5/0058 |
| 2019/0009379 | A1* | 1/2019 | Kiuchi | B23Q 3/15713 |
| 2019/0084124 | A1* | 3/2019 | Sekiya | H01L 21/67092 |
| 2020/0398452 | A1* | 12/2020 | Terada | B28D 5/022 |
| 2022/0055242 | A1* | 2/2022 | Okamura | B28D 5/022 |
| 2022/0258294 | A1* | 8/2022 | Izumi | B26D 7/2621 |

FOREIGN PATENT DOCUMENTS

| JP | 2007098536 A | 4/2007 |
| JP | 2016064450 A | 4/2016 |

* cited by examiner

*Primary Examiner* — Omar Flores Sanchez
(74) *Attorney, Agent, or Firm* — Greer Burns & Crain Ltd.

(57) ABSTRACT

A blade holding jig for holding a washer-type cutting blade via an annular retainer flange includes an annular flange holding portion configured to hold a first annular surface of the retainer flange under suction, and an annular non-contact suction portion arranged on an outer peripheral portion of the flange holding portion and configured to produce a negative pressure by ejection of a fluid toward the outer peripheral portion of the retainer flange held by the flange holding portion and to draw up the cutting blade toward the retainer flange. The cutting blade drawn up toward the retainer flange by the non-contact suction portion is held on the retainer flange by a suction force acting from the flange holding portion via a plurality of through holes disposed extending from a second annular surface to the first annular surface of the retainer flange.

11 Claims, 19 Drawing Sheets

BLADE HOLDING JIG

BACKGROUND OF THE INVENTION

Field of the Invention

The present invention relates to a blade holding jig for holding a washer-type cutting blade via a retainer flange, a cutting machine including the blade holding jig, and a method for mounting the washer-type cutting blade on a receiver flange by using the blade holding jig.

Description of the Related Art

Cutting machines for cutting various plate-shaped workpieces such as semiconductor wafers are known. A cutting machine includes a spindle, and a cutting blade is mounted on one end portion of the spindle. The cutting blade is an expendable item, and a used cutting blade is manually replaced by an operator in general. Replacement work of a cutting blade requires skill. Further, erroneous mounting of a cutting blade of a different kind on a spindle may lead to damage of a workpiece. Therefore, the replacement work of a cutting blade is important in the cutting of a workpiece, and requires care.

In order to eliminate a human error in the replacement work of a cutting blade, a blade replacement apparatus was developed to replace the used cutting blade by a new cutting blade automatically instead of manually by an operator (see, for example, Japanese Patent Laid-open No. 2007-98536). The blade replacement apparatus has, as a target of replacement, a hub-type cutting blade in which an annular base (in other words, a hub) made from a metal such as aluminum and a cutting edge disposed on an outer peripheral portion of the base are integrally formed.

The blade replacement apparatus dismounts the used hub-type cutting blade with the hub gripped therein from a spindle, and mounts a new hub-type cutting blade also with a hub gripped therein on the spindle. As cutting blades, however, not only hub-type cutting blades but also base-free (in other words, consisting of an annular cutting edge alone), washer-type cutting blades are used widely. A washer-type cutting blade is held between an annular receiver flange fixed on a spindle and an annular retainer flange mounted on the receiver flange, and is thus fixed relative to the spindle.

As no hub exists as a grippable target in a washer-type cutting blade, it is difficult to grip the washer-type cutting blade mechanically. Hence, a blade replacement jig has been contrived to hold a washer-type cutting blade under suction via an annular retainer flange (see, for example, Japanese Patent Laid-open No. 2016-64450). The retainer flange includes a flange surface to be brought into contact with the washer-type cutting blade and an annular surface located on a side opposite to the flange surface. Extending from the flange surface to the annular surface, a plurality of through holes is formed through the retainer flange between an inner periphery and an outer periphery thereof. By applying a negative pressure from the blade replacement jig to the flange surface via the through holes with the blade replacement jig being kept in contact at a suction portion thereof with the annular surface of the retainer flange, the washer-type cutting blade can be held under suction on the flange surface.

SUMMARY OF THE INVENTION

To hold the washer-type cutting blade under suction, however, the suction portion of the blade replacement jig is pressed against the side of the annular surface of the retainer flange with the washer-type cutting blade arranged on the side of the flange surface. At this time, a potential problem arises such that the washer-type cutting blade may be damaged by pressing. With such a problem in view, the present invention has as an object thereof the provision of a blade holding jig that can reduce the risk that a washer-type cutting blade may be damaged when it is held via a retainer flange.

In accordance with a first aspect of the present invention, there is provided a blade holding jig for holding a washer-type cutting blade via an annular retainer flange to be mounted on a distal end portion of a spindle so as to hold the cutting blade in cooperation with a receiver flange fixed on the distal end portion. The blade holding jig includes an annular flange holding portion configured to hold a first annular surface of the retainer flange under suction and an annular non-contact suction portion arranged on an outer peripheral portion of the flange holding portion and configured to produce a negative pressure by ejecting a fluid toward an outer peripheral portion of the retainer flange held by the flange holding portion and to draw up the cutting blade toward the retainer flange. The cutting blade drawn up toward the retainer flange by the non-contact suction portion is held on the retainer flange by a suction force acting from the flange holding portion via a plurality of through holes disposed through the retainer flange so as to extend from a second annular surface to the first annular surface of the retainer flange, the second annular surface being located on a side opposite to the first annular surface and in contact with one side of the cutting blade.

Preferably, the non-contact suction portion may be configured to eject the fluid so as to produce a swirl flow of the fluid in a periphery of the outer peripheral portion of the retainer flange.

Preferably, the non-contact suction portion may include an annular raised portion and a plurality of openings disposed in an outer peripheral side surface of the annular raised portion, and a flow path may be connected to each of the openings so that the fluid is ejected at a predetermined oblique angle with respect to a tangential direction to the outer peripheral side surface.

Preferably, the flange holding portion may include an annular pad portion that comes into contact with the first annular surface of the retainer flange.

Preferably, a first flow path may be connected via a first on/off valve to the flange holding portion and may be configured to cause a negative pressure to act on the flange holding portion via the first on/off valve, and a second flow path may be connected to the non-contact suction portion and may be configured to supply the fluid to the non-contact suction portion via the second on/off valve.

Preferably, the blade holding jig may further include a pressure measuring meter that measures the negative pressure produced in the first flow path and a suction determination section configured to determine through comparison between the negative pressure in the first flow path as measured by the pressure measuring meter and a first pressure whether or not the retainer flange is sucked on the flange holding portion and through comparison between the negative pressure in the first flow path as measured by the pressure measuring meter and a second pressure greater in magnitude than the first pressure whether or not the cutting blade is sucked on the second annular surface of the retainer flange.

Preferably, the flange holding portion may have a positioning fitting portion that fits on a cylindrical raised portion arranged so as to extend through an opening in the annular retainer flange.

Preferably, the blade holding jig may further include a camera unit configured to image a mark that is formed on the one side of the cutting blade and that contains information on the kind of the cutting blade and a mark reading section that reads the mark imaged by the camera unit.

Preferably, the blade holding jig may further include a third flow path connected to the flange holding portion via a third on/off valve, and the cutting blade may be separated from the second annular surface of the retainer flange by ejection of the fluid from the third flow path toward the cutting blade held under suction on the second annular surface of the retainer flange by the flange holding portion.

In accordance with a second aspect of the present invention, there is provided a cutting machine including a cutting unit in which a washer-type cutting blade is to be mounted on a receiver flange fixed on a distal end portion of a spindle. The cutting machine includes a blade stock board that stores the cutting blade, a replacement apparatus that replaces the cutting blade to be mounted on the receiver flange, and a moving unit that moves the replacement apparatus between a replacing position where the cutting blade is replaced and a retracted position. The replacement apparatus has the above-described blade holding jig, the above-described nut holding portion that holds a retainer nut to be fastened on the receiver flange, and a nut rotating portion that rotates the retainer nut.

In accordance with a third aspect of the present invention, there is provided a method for mounting a washer-type cutting blade on a receiver flange fixed on a distal end portion of a spindle, by using a blade holding jig. The blade holding jig includes an annular flange holding portion configured to hold under suction a first annular surface of the annular retainer flange to be mounted on the distal end and an annular non-contact suction portion arranged on an outer peripheral portion of the flange holding portion and configured to produce a negative pressure by ejection of a fluid toward an outer peripheral portion of the retainer flange held by the flange holding portion and to draw up the cutting blade toward the retainer flange. The retainer flange has a plurality of through holes disposed through the retainer flange so as to extend from a second annular surface to the first annular surface of the retainer flange, the second annular surface being located on a side opposite to the first annular surface and in contact with one side of the cutting blade. The method includes a retainer flange holding step of holding under suction the first annular surface of the retainer flange that is supported at the second annular surface thereof on the blade stock board, by the flange holding portion, a retainer flange moving-close step of moving the second annular surface of the retainer flange held under suction, close to the cutting blade mounted on the blade stock board, to decrease a distance between the second annular surface and the cutting blade to a predetermined length or less, a cutting blade drawing-up step of, after the retainer flange moving-close step, ejecting the fluid from the non-contact suction portion to produce a negative pressure and to suck the cutting blade and drawing up the cutting blade toward the second annular surface, a cutting blade holding step of holding the cutting blade that has come close to the second annular surface in the cutting blade drawing-up step, on the second annular surface by a suction force acting from the through holes, and a mounting step of mounting the cutting blade and the retainer flange on the receiver flange fixed on the spindle so that the cutting blade is held between the receiver flange and the retainer flange with the cutting blade held on the second annular surface of the retainer flange by the suction force.

The blade holding jig according to the first aspect of the present invention includes the annular flange holding portion configured to hold under suction the first annular surface of the retainer flange. The blade holding jig also includes the annular non-contact suction portion arranged on the outer peripheral portion of the flange holding portion and configured to produce the negative pressure by ejecting the fluid toward the outer peripheral portion of the retainer flange held by the flange holding portion and to draw up the washer-type cutting blade toward the retainer flange. Through the retainer flange, the through holes are disposed so as to extend from the second annular surface to the first annular surface of the retainer flange, the second annular surface being located on the side opposite to the first annular surface and in contact with the one side of the cutting blade. After the first annular surface of the retainer flange is held under suction on the flange holding portion, the cutting blade is drawn up toward the retainer flange by the negative pressure produced by ejection of the fluid from the non-contact suction portion. The cutting blade is then held under suction on the retainer flange by the negative pressure produced by ejection of the fluid via the through holes in the retainer flange. As described above, the washer-type cutting blade can be held under suction without being pressed by the blade replacement jig via the retainer flange. It is thus possible to reduce the risk that the washer-type cutting blade may be damaged.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
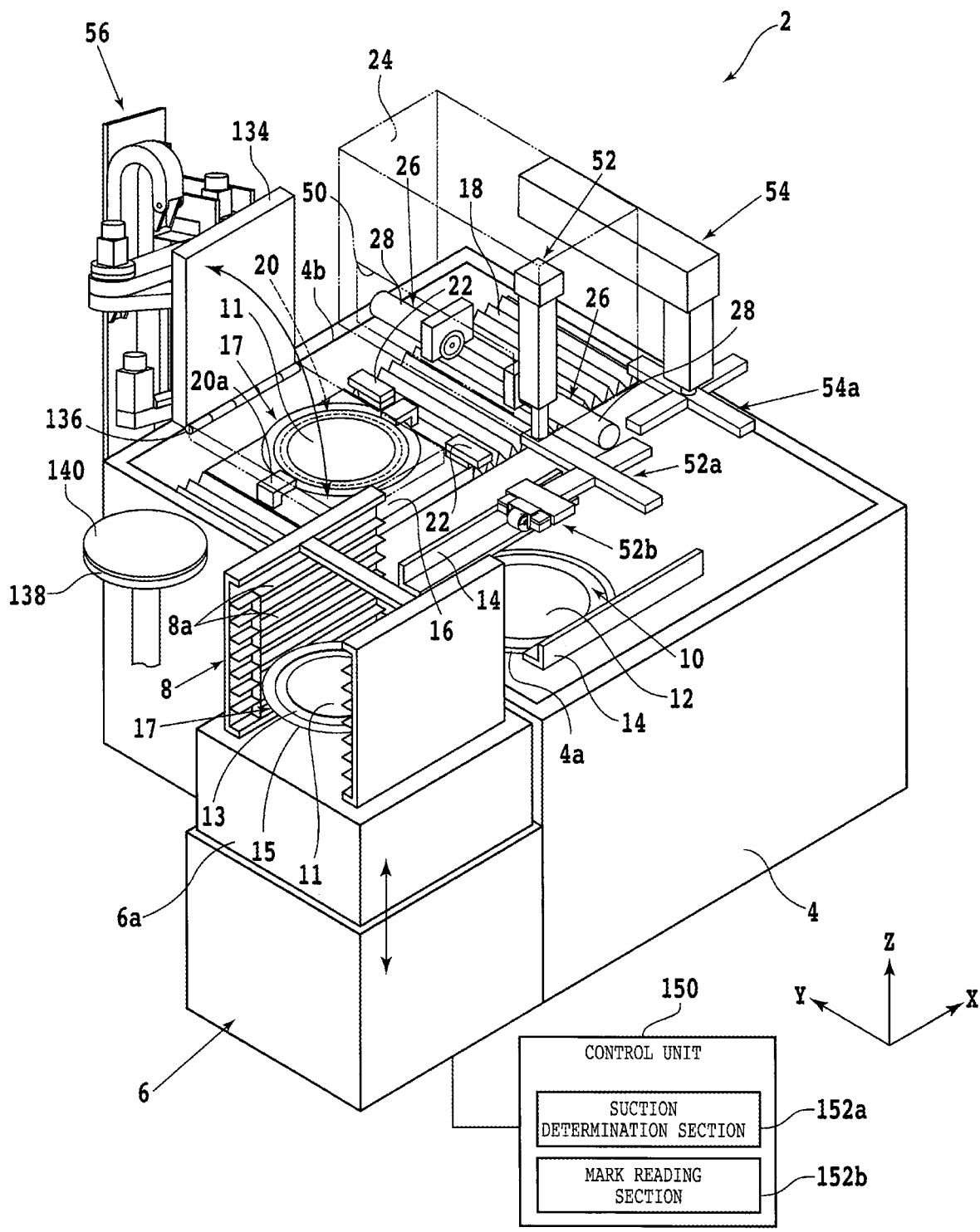
FIG. 1 is a perspective view of a cutting machine according to a first embodiment.

With reference to the attached drawings, a description will be made in detail about embodiments according to the first aspect of the present invention. FIG. 1 is a perspective view of a cutting machine 2 according to a first embodiment. An X-axis direction (machining feed direction), a Y-axis direction (indexing feed direction), and a Z-axis direction (vertical direction, height direction) illustrated in FIG. 1 mutually intersect at right angles. It is to be noted that, in FIG. 1, some of the elements are illustrated as functional blocks. The cutting machine 2 includes a bed 4 that supports the individual elements. In a corner section of the bed 4, an elevator 6 that is movable up and down by a lift mechanism (not depicted) is disposed.

On an upper surface of an elevating table 6a of the elevator 6, a cassette 8 is mounted. The cassette 8 has, for example, a pair of opposing side walls and connecting portions that connect the paired side walls. On an inner side of each side wall, a plurality of support strips 8a is disposed at predetermined intervals in a height direction. By a pair of support strips 8a disposed at the same height on the inner sides of the respective side walls, a piece of workpiece 11 is supported. The workpiece 11 is, for example, a disc-shaped wafer made of a semiconductor material such as silicon. It is to be noted that no limitations are imposed on the material, shape, structure, size, and the like of the workpiece 11.

On a side of a front surface of the workpiece 11, a plurality of intersecting dicing lines (hereinafter referred to as "streets") is set. On sides of front surfaces of individual regions defined by the streets, devices such as integrated circuits (ICs) are formed. On a side of a back surface of the workpiece 11 (a surface located on a side opposite to the front surface), a circular tape (dicing tape) 13 is bonded. The tape 13 has a diameter greater than that of the workpiece 11, and the workpiece 11 is bonded on the side of the back surface thereof to a center portion of the tape 13. On an outer peripheral portion of the tape 13, on the other hand, a metal-made, annular frame 15 is bonded. In the cassette 8, the workpiece 11 is accommodated in the form of a workpiece unit 17 with the workpiece 11 supported by the frame 15 via the tape 13. It is to be noted that one or more workpieces 11 are accommodated in the cassette 8.

In a region adjacent, in the X-axis direction, to the elevator 6, an opening 4a is formed. In the opening 4a, a cleaning unit 10 is disposed to clean the workpiece 11 after cutting. The cleaning unit 10 has a spinner table 12 that rotates about an axis of rotation parallel to the Z-axis direction. Above the spinner table 12, a nozzle (not depicted) are disposed to eject a mixed fluid of gas and liquid in which liquid such as pure water and air are mixed together. A pair of guide rails 14 is disposed above the cleaning unit 10.

The paired guide rails 14 are moved by an undepicted drive mechanism so that they are moved toward and away from each other along the Y-axis direction. As a result, the position of the workpiece unit 17 in the Y-axis direction is adjusted. At a position adjacent, in the Y-axis direction, to the guide rails 14, an opening 4b is formed. The opening 4b is a rectangular opening having long sides along the X-axis direction. Over the opening 4b, a rectangular table cover 16 is disposed covering a part of the opening 4b. On both sides of the table cover 16 in the X-axis direction, corrugated dust/splash covers 18 that are stretchable in the X-axis direction are disposed.

Above the table cover 16, a chuck table 20 is disposed to hold the workpiece unit 17 and its associated elements under suction. The chuck table 20 has a disc-shaped frame body (not depicted) formed of a metal such as stainless steel. A disc-shaped recessed portion is formed in an upper portion of the frame body, and a disc-shaped porous plate (not depicted) is fixed in the recessed portion. The porous plate is connected, on a side of a lower surface thereof, to the side of one end of a flow path. To the side of the other end of the flow path, a suction source (not depicted) such as an ejector is connected.

When the suction source is operated, a negative pressure is produced on a substantially planar upper surface (holding surface) of the porous plate. When the suction source is operated, for example, after the workpiece unit 17 is mounted on the chuck table 20 so as to be exposed at the front surface of the workpiece 11, the workpiece 11 is held on the side of the back surface thereof under suction on the holding surface. On a side portion of the chuck table 20, clamp units 20a are disposed to clamp the frame 15 of the workpiece unit 17. For example, the clamp units 20a are disposed in pairs so that a center of the holding surface of the chuck table 20 is flanked by the paired clamp units 20a.

Above the table cover 16 and on the side of one end in the X-axis direction of the chuck table 20, a pair of dresser tables 22 is arranged so that they are apart from each other in the Y-axis direction. The dresser tables 22 are smaller than the chuck table 20, and are rectangular in top plan view. The dresser tables 22 have substantially planar upper surfaces (holding surfaces). On the holding surfaces of each dresser table 22, a dressing board of a rectangular plate shape (not depicted) is held under suction at one side thereof. The dresser boards are used when sharpening of a cutting blade 34 (to be described later) is performed.

Below the table cover 16, a rotational drive source (not depicted) such as a motor is arranged to rotate the chuck table 20 about an axis of rotation parallel to the Z-axis direction. A rotating shaft of the rotational drive source is connected to a lower surface of the frame body of the chuck table 20. Below the rotational drive source, an X-axis moving mechanism (processing feed unit) of the ball screw type (not depicted) is disposed. By operating the X-axis moving mechanism, the table cover 16 and the chuck table 20 are moved along the X-axis direction.

A region of the opening 4b, the region being adjacent in the Y-axis direction to the opening 4a, is a loading/unloading region where loading and unloading of the workpiece 11 is performed. On the other hand, another region of the opening 4b, the region being located on a side opposite to the loading/unloading region in the X-axis direction, is a cutting region where cutting of the workpiece 11 is performed. Above the cutting region, a parallelepipedal cover member 24 formed of metal or the like is disposed. A pair of cutting units 26 is arranged inside a space covered by the cover member 24. Here, a description will be made about the configuration of the cutting units 26 with reference to FIGS. 2 and 3.

Figure 2:
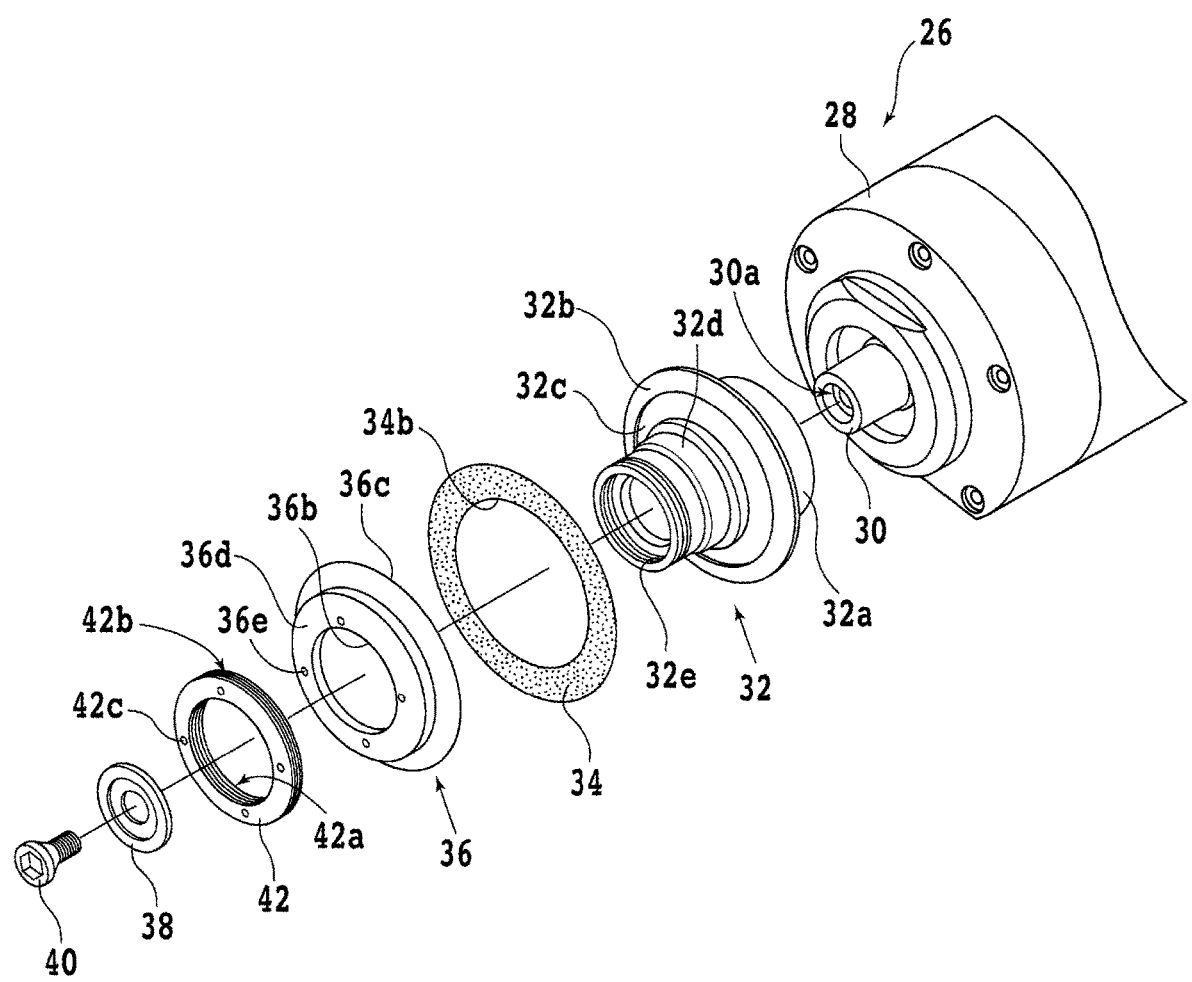
FIG. 2 is an exploded perspective view of each cutting unit.
Figure 3:
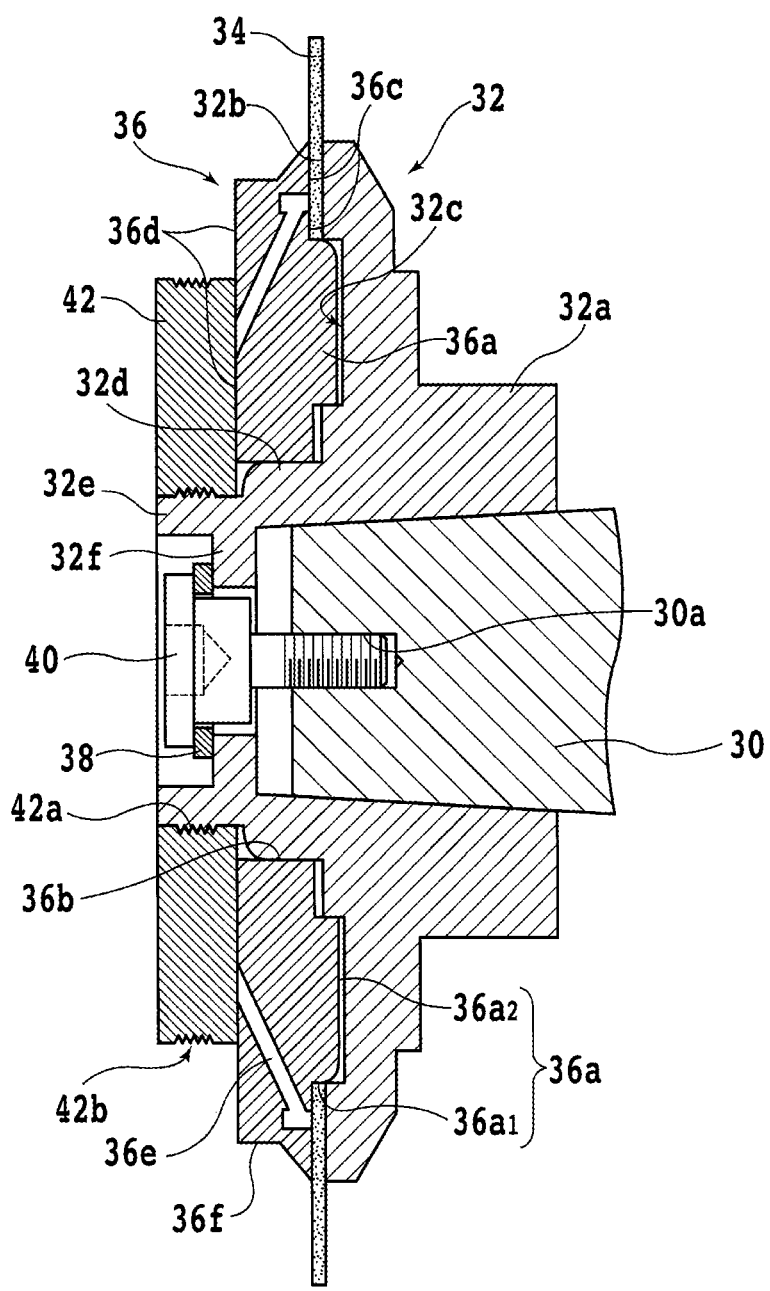
FIG. 3 is a fragmentary cross-sectional side view of the cutting unit.

FIG. 2 is an exploded perspective view of each cutting unit 26, and FIG. 3 is a fragmentary cross-sectional side view of the cutting unit 26. The cutting unit 26 has a cylindrical spindle housing 28. A portion of a rod-shaped spindle 30 is arranged in the spindle housing 28. The spindle 30 is supported in a rotatable fashion on the spindle housing 28. A rotational drive source (not depicted) such as a motor is disposed on one end portion of the spindle 30. The spindle 30 projects, at the other end portion (distal end portion) thereof, from the spindle housing 28, and a bolt hole 30a is formed in the distal end portion of the spindle 30.

On the distal end portion of the spindle 30, a substantially disc-shaped receiver flange 32 is arranged. On one side of a central portion of the receiver flange 32, a first boss portion 32a is formed. The distal end portion of the spindle 30 fits in an inner recessed portion of the first boss portion 32a. On the other side of the central portion of the receiver flange 32 (in other words, on a side opposite to the first boss portion 32a), an annular flange surface 32b is arranged so that it comes into contact with the washer-type cutting blade 34. An annular recessed portion 32c is formed on a side inner than the flange surface 32b.

On a side inner than the recessed portion 32c, a second boss portion 32d is formed. On a side inner than the second boss portion 32d, a third boss portion 32e is formed so that it projects more than the second boss portion 32d from the other side of the receiver flange 32. External threads are formed on an outer peripheral surface of the third boss portion 32e. In addition, on an inner side of the third boss portion 32e, an annular receiving portion 32f is formed to receive a washer 38 and a bolt 40.

On the other side of the receiver flange 32, an annular retainer flange 36 is arranged to hold the cutting blade 34 in cooperation with the receiver flange 32. The retainer flange 36 has an annular protruding portion 36a on a side facing the receiver flange 32. The protruding portion 36a has a shape that fits in the above-mentioned recessed portion 32c. On a side radially inner than the protruding portion 36a, a through opening (opening) 36b is formed with substantially the same inner diameter as an outer diameter of the second boss portion 32d. On a side radially outer than the protruding portion 36a, a flange surface (second annular surface) 36c is formed as a surface to be brought into contact with the cutting blade 34.

The protruding portion 36a protrudes more than the flange surface 36c, and on a bottom portion of an outer peripheral portion of the protruding portion 36a, an outer peripheral side surface $36a_1$ is formed. The outer peripheral side surface $36a_1$ is connected to an inner peripheral end portion of the flange surface 36c so that the outer peripheral side surface $36a_1$ perpendicularly intersects the inner peripheral end portion. The protruding portion 36a has an annular surface $36a_2$, and on the outer peripheral portion of the protruding portion 36a on the side of the surface $36a_2$, a corner portion having a rounded shape is formed. In other words, the protruding portion 36a has an outer diameter that becomes gradually smaller from the side of the bottom portion of the protruding portion 36a toward the surface $36a_2$ of the protruding portion 36a.

On a side opposite to the protruding portion 36a and the flange surface 36c, an annular surface (first annular surface) 36d is formed. In the retainer flange 36, a plurality of through holes 36e is formed extending from the annular surface 36d to the flange surface 36c. Each through hole 36e is formed so that it is directed toward a radially outer side of the retainer flange 36 as it extends from the annular surface 36d to the flange surface 36c. Through the retainer flange 36, for example, four through holes 36e are formed. For example, the four through holes 36e each have a hole diameter of approximately 1 mm and are arranged at substantially equal intervals along a peripheral direction of the annular surface 36d.

On an outer peripheral portion of the third boss portion 32e of the receiver flange 32, an annular retainer nut 42 is arranged so that it comes into contact with the annular surface 36d. On an inner peripheral side surface of the retainer nut 42, internal threads 42a are formed. In an outer peripheral surface of the retainer nut 42, annular grooves 42b are formed for use when the retainer nut 42 is gripped. In addition, a plurality of holes 42c is formed in one annular side surface of the retainer nut 42, so that pins 84, which will be described below, fit in the holes 42c.

Now, a description will be made of an outline of procedures to mount the cutting blade 34 on the distal end portion of the spindle 30. First, with the washer 38 arranged on the receiving portion 32f, the bolt 40 is fastened at a shank thereof to a bolt hole 30a. As a result, the receiver flange 32 is fixed on the distal end portion of the spindle 30. Next, with the cutting blade 34 held under suction on the flange surface 36c (details will be mentioned later), the protruding portion 36a is brought into fitting engagement with the recessed portion 32c. At this time, the inner peripheral side surface of the through opening 36b comes into contact with the second boss portion 32d. In this state, the retainer nut 42 is fastened to the third boss portion 32e, whereby the cutting blade 34 is fixed between the receiver flange 32 and the retainer flange 36, and the cutting blade 34 and the retainer flange 36 are secured on the receiver flange 32.

Now referring back to FIG. 1, a description will be made about other elements of the cutting machine 2. In a side wall of the cover member 24 on a side of the loading/unloading region, a door portion 50 is disposed. The door portion 50 is movable in a top-down direction or left-right direction to open or close the side wall of the cover member 24. Above the bed 4, a first transfer unit 52 is disposed. The first transfer unit 52 is movable along the X-axis direction and the Y-axis direction by a horizontal direction moving mechanism (not depicted). The first transfer unit 52 has an air cylinder with a longitudinal axis thereof extending along the Z-axis direction.

In the air cylinder, a portion of a rod is accommodated. When the air cylinder is operated, the rod moves in the Z-axis direction. The rod is provided at a lower end portion thereof with a suction unit 52a. The suction unit 52a has a bracket of a substantially cruciform shape in top plan view and a plurality of suction heads (not depicted) disposed on a side of a lower surface of the bracket. The suction unit 52a can suck the frame 15 of the workpiece unit 17. On an end portion of the suction unit 52a, the end portion being on a side of the elevator 6, a grip mechanism 52b capable of griping a part of an outer peripheral portion of the frame 15 is disposed.

Above the first transfer unit 52, an arm portion of a second transfer unit 54 is disposed. The second transfer unit 54 is movable along the X-axis direction and the Y-axis direction by a horizontal direction moving mechanism (not depicted). The second transfer unit 54 also has an air cylinder with a longitudinal axis thereof extending along the Z-axis direction and a rod a portion of which is accommodated in the air cylinder. The rod is provided at a lower end portion thereof with a suction unit 54a. The suction unit 54a also has a bracket of a substantially cruciform shape in top plan view and a plurality of suction heads (not depicted) disposed on a side of a lower surface of the bracket.

Here, a brief description will be made of procedures to cut the workpiece 11 with the cutting machine 2. First, with the frame 15 gripped by the grip mechanism 52b, the workpiece unit 17 is pulled out from the cassette 8 onto the paired guide rails 14 by the first transfer unit 52. After the position in the Y-axis direction of the workpiece unit 17 is adjusted by the paired guide rails 14, the frame 15 is sucked by the suction unit 52a, and the workpiece unit 17 is transferred onto the chuck table 20 located in the loading/unloading region depicted in FIG. 1 by the first transfer unit 52.

Then, with the workpiece 11 held under suction on the side of the back surface thereof on the chuck table 20, the X-axis moving mechanism is operated to move the chuck table 20 to the cutting region. After alignment or the like is performed, the workpiece 11 is cut by the cutting units 26. Subsequent to the cutting, the chuck table 20 is moved back to the loading/unloading region. The frame 15 is then sucked by the suction unit 54a, and by the second transfer unit 54, the workpiece unit 17 is transferred from the chuck table 20 to the cleaning unit 10.

During cleaning of the workpiece 11, the spinner table 12 is rotated with the workpiece 11 held on the side of the back surface thereof under suction on the spinner table 12. The mixed fluid of gas and liquid is then ejected toward the side of the front surface of the workpiece 11, whereby the workpiece 11 is cleaned, followed by drying. Subsequent to the drying, the workpiece unit 17 is transferred onto the paired guide rails 14 by the first transfer unit 52. Using the grip mechanism of the first transfer unit 52, the workpiece unit 17 is then pushed from the paired guide rails 14 into the cassette 8.

Figure 4:
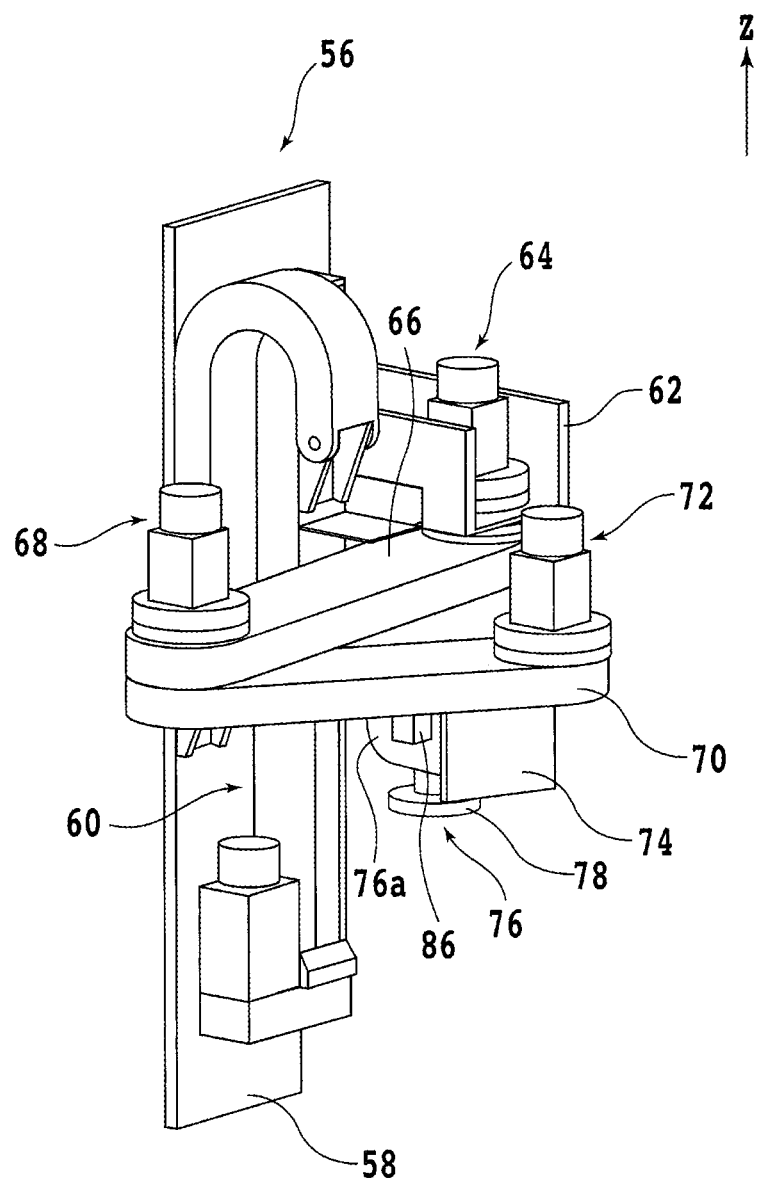
FIG. 4 is a perspective view of a blade replacement unit during a standby period.
Figure 5:
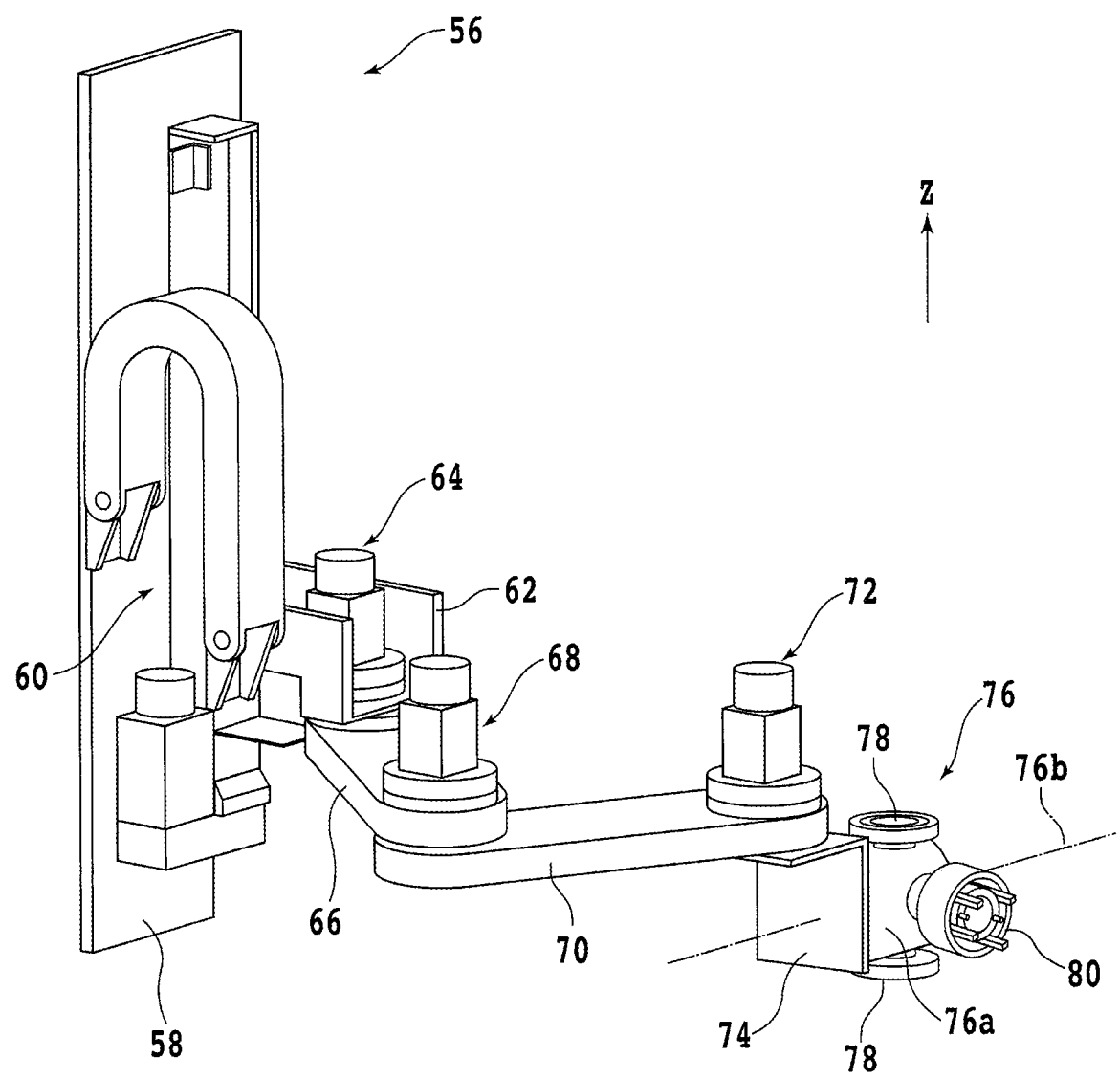
FIG. 5 is a perspective view of the blade replacement unit during replacement work.

It is to be noted that the cutting blade 34 progressively wears as cutting proceeds. There is hence a need to replace the worn cutting blade 34. The cutting machine 2 of the present embodiment has a blade replacement unit 56 for replacing the washer-type cutting blade 34. With reference to FIGS. 4 and 5, the blade replacement unit 56 will be described. FIG. 4 is a perspective view of the blade replacement unit 56 during a standby period, and FIG. 5 is a perspective view of the blade replacement unit 56 during replacement work for replacing the used cutting blade 34 with a new cutting blade 34.

The blade replacement unit 56 has a base plate 58 fixed to the bed 4. On the base plate 58, a lift mechanism 60 is disposed to move an articulated robot along the Z-axis direction. The lift mechanism 60 has a motor (not depicted) disposed on a lower portion of the base plate 58 and a drive pulley (not depicted) connected to a rotating shaft of the motor. Further, a driven pulley (not depicted) is disposed on an upper portion of the base plate 58.

A toothed endless belt (not depicted) is wrapped on the drive pulley and driven pulley, and on a portion of this toothed endless belt, a first support bracket 62 made of metal is fixed. The first support bracket 62 moves along the Z-axis direction as the toothed endless belt moves. For example, if the rotating shaft of the motor of the lift mechanism 60 is rotated in a predetermined direction, the first support bracket 62 moves upward, and if the rotating shaft of the motor is rotated in a direction opposite to the predetermined direction, the first support bracket 62 moves downward. It is to be noted that the lift mechanism 60 is not limited to the configuration of a toothed endless belt.

The lift mechanism 60 may be a lift mechanism of the ball screw type. The lift mechanism of the ball screw type has a pair of guide rails (not depicted) with longitudinal axes thereof arranged along the Z-axis direction. On the paired guide rails, a movable plate (not depicted) is attached so that the movable plate is slidable in the Z-axis direction. On a side of one side of the movable plate, nut portions (not depicted) are disposed. A ball screw that is substantially parallel to the guide rails is in threaded engagement with the nut portions. A pulse motor (not depicted) is connected to one end of the ball screw. On the other side of the movable plate, the above-mentioned first support bracket 62 is fixedly secured. When the pulse motor is rotated in a predetermined direction, the first support bracket 62 moves upward. When the pulse motor is rotated in a direction opposite to the predetermined direction, on the other hand, the first support bracket 62 moves downward.

To the first support bracket 62, a first rotating mechanism 64 having a rotational drive source such as a motor is secured. The rotational drive source has a rotating shaft arranged substantially parallel to the Z-axis direction. To the rotating shaft, a first arm 66 is secured at one end portion thereof. The first arm 66 is arranged so that its longitudinal axis intersects the Z-axis direction substantially at right angles. To the other end portion of the first arm 66, a second rotating mechanism 68 is secured. The second rotating mechanism 68 has a rotational drive source such as a motor with a rotating shaft thereof arranged substantially parallel to the Z-axis direction. To the rotating shaft, a second arm 70 is secured at one end portion thereof. The second arm 70 is arranged so that its longitudinal axis intersects the Z-axis direction substantially at right angles.

To the other end portion of the second arm 70, a third rotating mechanism 72 is secured. The third rotating mechanism 72 has a rotational drive source such as a motor, and the rotational drive source has a rotating shaft arranged substantially parallel to the Z-axis direction. To the rotating shaft, a second support bracket 74 made of metal is secured. On the second support bracket 74, a replacement apparatus 76 is fixed. By a moving unit including the above-mentioned lift mechanism 60, first rotating mechanism 64, first arm 66, second rotating mechanism 68, second arm 70, third rotating mechanism 72, and the like, the replacement apparatus 76 is moved between a retracted position depicted in FIG. 4 and a replacement position depicted in FIG. 5.

Figure 6:
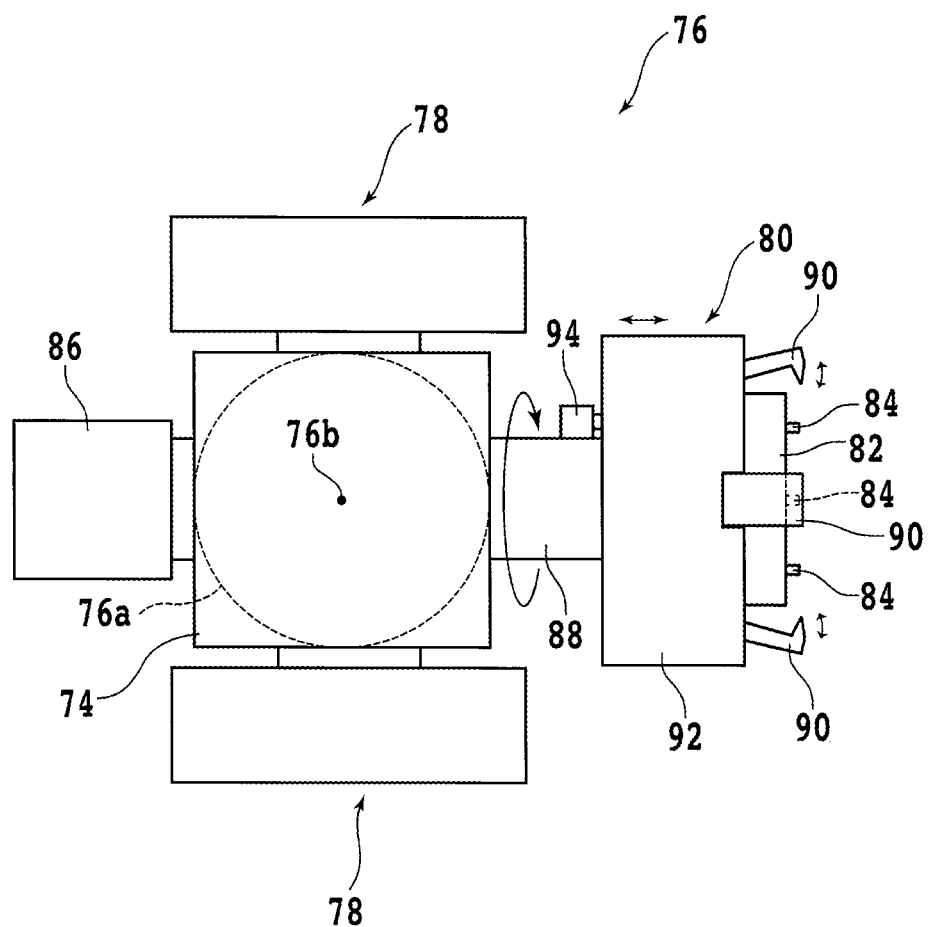
FIG. 6 is a side view of a replacement apparatus.

The replacement apparatus 76 has a substantially cylindrical housing 76a. Inside the housing 76a, a rotational drive source (not depicted) such as a motor is accommodated to rotate the housing 76a about a rotation axis 76b extending along a height direction of a cylinder of the housing 76a. FIG. 6 is a side view of the replacement apparatus 76. On a side wall of the housing 76a, a pair of blade holding jigs 78 is arranged so as to flank the rotation axis 76b. On the side wall of the housing 76a, a nut holding portion 80 is disposed between two planes in which the paired blade holding jigs 78 lie respectively, to rotate the retainer nut 42.

The nut holding portion 80 has a protruding portion 82, which includes a cylindrical small-diameter portion and a large-diameter portion arranged coaxially with the small-diameter portion. On one end portion of the large-diameter portion, four pins 84, which are each biased at one end thereof by a biasing member such as a spring, are arranged at equal intervals along a peripheral direction of the large-diameter portion. To one end portion of the small-diameter portion, the one end portion being located on a side opposite to the large-diameter portion, an output shaft (predetermined rotating shaft) 88 of a motor (rotational drive source) 86 is connected. The motor 86 and the output shaft 88 make up a nut rotating portion. Around the output shaft 88, four pawls 90 are arranged at equal intervals along a peripheral direction of the protruding portion 82. The pawls 90 are each connected at a proximal end portion thereof to the small-diameter portion of the protruding portion 82. The pawls 90 each protrude, at a distal end portion thereof, beyond the one end portion of the large-diameter portion of the protruding portion 82, and are each located, at the distal end portion thereof, on a radially outer side of the large-diameter portion and small-diameter portion.

Between a region located between the distal end portion and the proximal end portion of each pawl 90 and an outer peripheral portion of the large-diameter portion, a biasing member (not depicted) such as a compression spring is arranged, so that the pawl 90 is biased radially outward of the protruding portion 82. On a radially outer side of the respective pawls 90, a cylindrical cover member 92 is disposed. The cover member 92 is movable along a longitudinal direction of the output shaft 88 by an actuator 94 such as an air cylinder fixed on the output shaft 88. When the cover member 92 is pushed outward in a longitudinal direction, the distal end portions of the individual pawls 90 radially move so as to move close to the protruding portion 82. When the cover member 92 is pulled inward in the longitudinal direction, on the other hand, the distal end portions of the individual pawls 90 radially move so as to move away from the protruding portion 82 by the biasing member. By moving the cover member 92 as described above, the distal end portions of the individual pawls 90 can be brought toward or away from one another.

When rotate the retainer nut 42 is to be rotated by the nut holding portion 80, the above-mentioned pins 84 are first inserted into the holes 42c. By pushing the cover member 92 outward in the longitudinal direction thereof, the distal end portions of the individual pawls 90 are brought into engagement with the annular groove 42b. With the retainer nut 42 held by the pawls 90, the motor 86 is operated to rotate the output shaft 88 in a predetermined direction. The nut holding portion 80 thus rotates in the predetermined direction, so that the retainer nut 42 is detached from the receiver flange 32. It is to be noted that rotation of the nut holding portion 80 in a direction opposite to the predetermined direction enables the retainer nut 42 to be fastened on the receiver flange 32.

Figure 7:
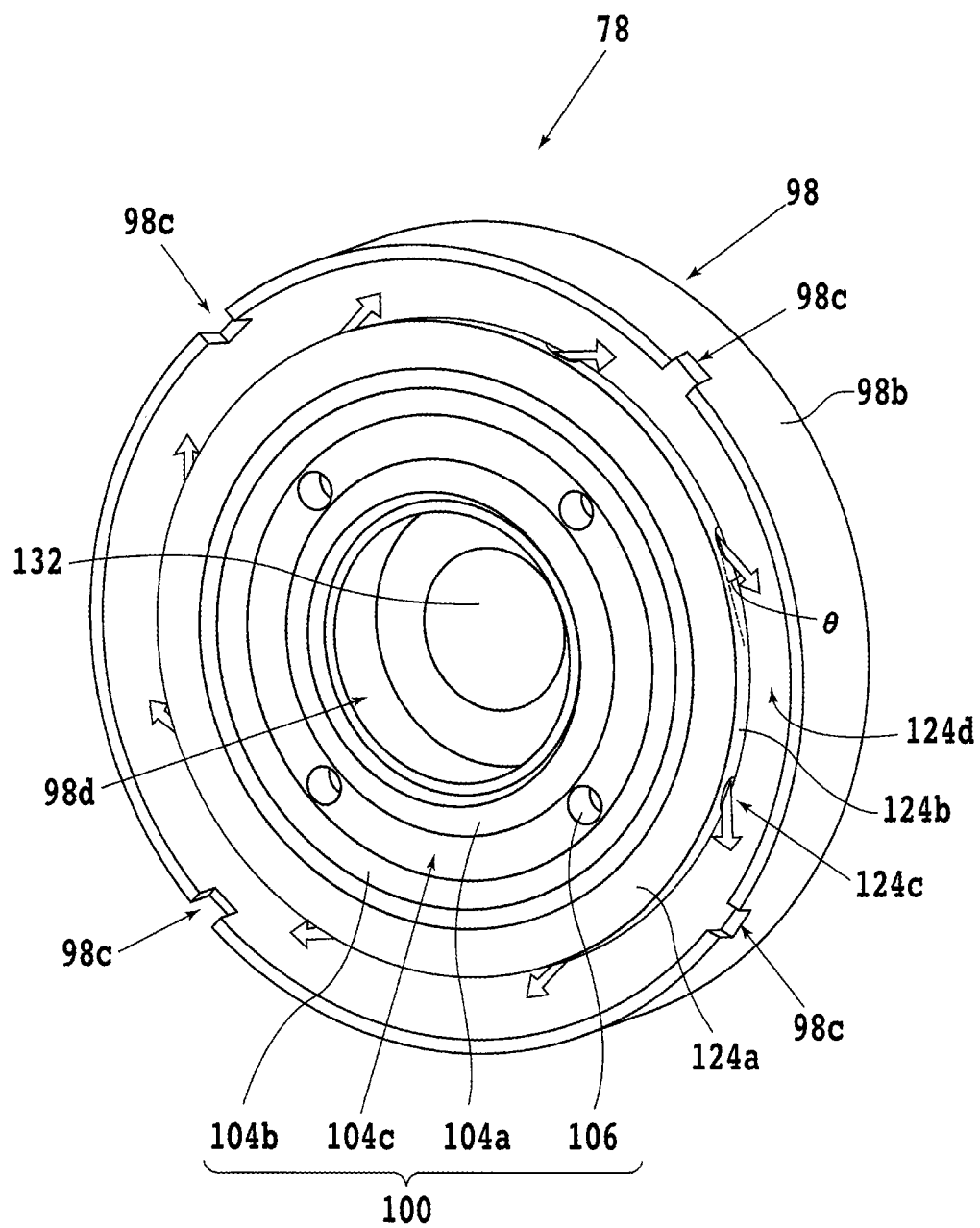
FIG. 7 is an enlarged perspective view of a blade holding jig.
Figure 8:
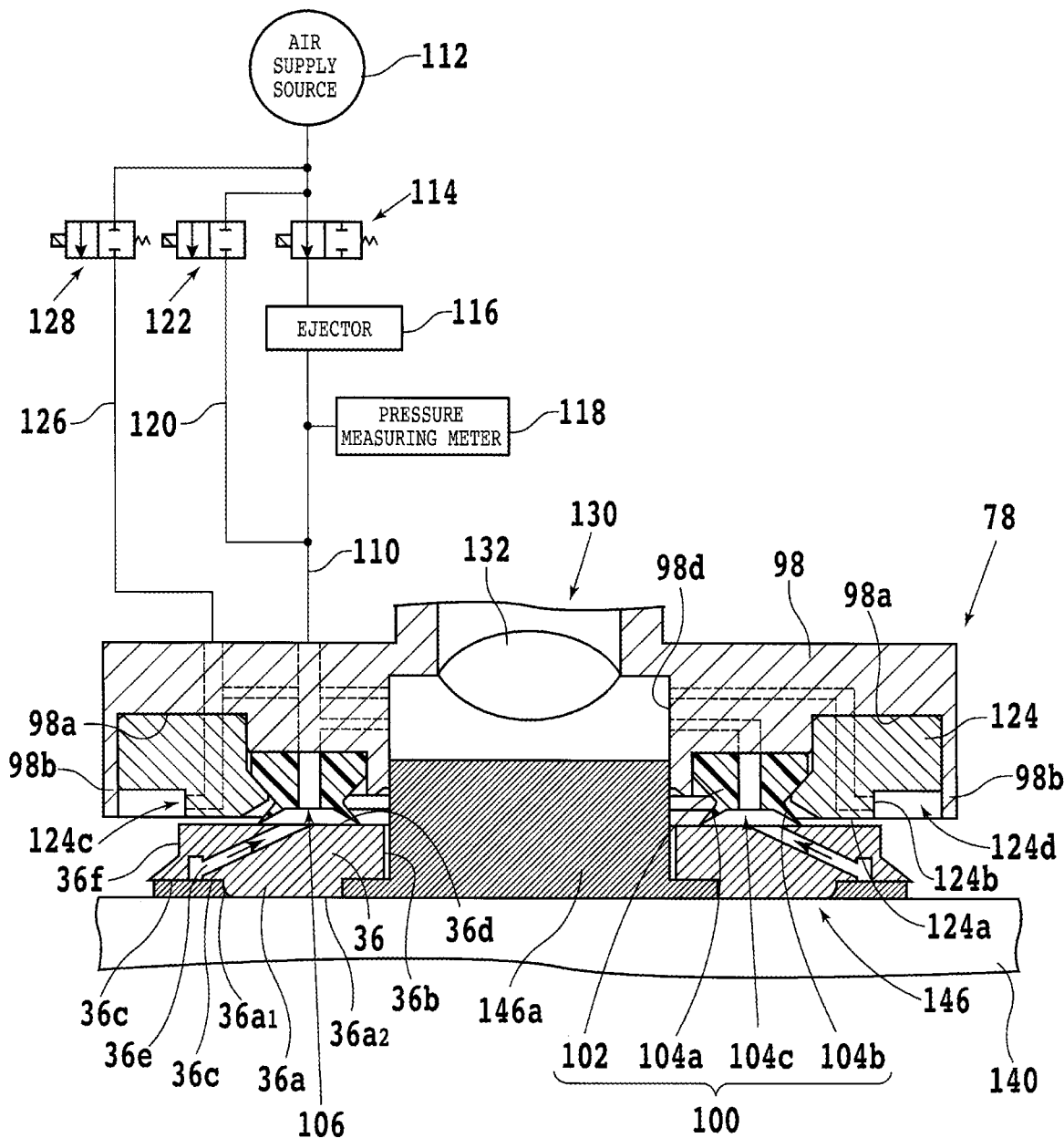
FIG. 8 is a fragmentary cross-sectional view of the blade holding jig and some associated elements.

A description will next be made about the structure of each blade holding jig 78. FIG. 7 is an enlarged perspective view of the blade holding jig 78. FIG. 8 is a fragmentary cross-sectional side view of the blade holding jig 78 and some associated elements. It is to be noted that, in FIG. 8, some of the elements are illustrated as functional blocks and fluid paths are simplified and indicated by lines. The blade holding jig 78 has a bottomed cylindrical frame body 98 made of metal or the like. In an opening portion of the frame body 98, an annular flange holding portion 100 formed from an elastic material such as rubber, resin, or elastomer is arranged.

The flange holding portion 100 includes an annular base portion 102 arranged on a side of a bottom portion of the frame body 98. On an inner periphery side of one surface of the base portion 102, an annular inner lip portion 104a is formed protruding from the base portion 102 toward the opening portion of the frame body 98. The inner lip portion 104a has a sloping surface inclined toward a center in a radial direction of the frame body 98 so that the inner lip portion 104a has a greater diameter at a proximal end portion thereof than a distal end portion thereof. On an outer periphery side of the one surface of the base portion 102, an annular outer lip portion 104b is formed protruding from the base portion 102 toward the opening of the frame body 98.

The outer lip portion 104b has a sloping surface inclined outward in the radial direction of the frame body 98 so that the outer lip portion 104b has a smaller diameter at a proximal end portion thereof than a distal end portion thereof. The inner lip portion 104a and the outer lip portion 104b function as an annular pad portion that comes into contact with the annular surface 36d of the retainer flange 36. By the inner lip portion 104a and outer lip portion 104b and the base portion 102, an annular recessed portion 104c is formed on the side of the one surface of the base portion 102. It is to be noted that the annular recessed portion 104c may be formed on the side of the one surface of the base portion 102 by concentrically arranging two O-rings of different diameters on the base portion 102, instead of the inner lip portion 104a and outer lip portion 104b.

On a side of a bottom portion of the recessed portion 104c, a plurality of through holes 106 is formed extending through the base portion 102. In the present embodiment, four through holes 106 are formed so that they separate from one another along a peripheral direction of the recessed portion 104c (see FIG. 7). As depicted in FIG. 8, the through holes 106 are connected to one end of a first flow path 110. To the other end of the first flow path 110, on the other hand, an air supply source 112 is connected. The air supply source 112 has, for example, a compressor that compresses air, a tank that stores compressed air, and a filter that removes water droplets and dust from air.

In the first flow path 110, a first valve (first on/off valve) 114 is disposed between the air supply source 112 and the through holes 106. The first valve 114 is, for example, a solenoid valve the on/off of which is electrically controlled. Between the first valve 114 and the through holes 106, an ejector 116 is disposed. When the first valve 114 is brought into an open state and air is supplied from the air supply source 112 to the ejector 116, the ejector 116 is allowed to produce a negative pressure in accordance with the Venturi effect.

The negative pressure produced at the ejector 116 acts on the through holes 106 via the first flow path 110. In the first flow path 110, a pressure measuring meter 118 (pressure sensor) is arranged to measure the pressure at a position between the ejector 116 and the through holes 106. Through measurement of the gauge pressure (the difference between the absolute pressure and the atmospheric pressure) by the pressure measuring meter 118, for example, the pressure (for example, negative pressure) in the first flow path 110 is measured. To the first flow path 110, a bypass flow path (third flow path) 120 is connected, whereby the bypass flow path 120 connects a point between the air supply source 112 and the first valve 114 and a point between the pressure measuring meter 118 and the through holes 106. In other words, the bypass flow path 120 is connected to the through holes 106 (in other words, the flange holding portion 100) via the first flow path 110. In the bypass flow path 120, a bypass flow path valve (third on/off valve) 122 is arranged. The bypass flow path valve 122 is, for example, a solenoid valve the on/off of which is electrically controlled.

When the first valve 114 is brought into a closed state and the bypass flow path valve 122 is brought into an open state, air (fluid) is ejected from the bypass flow path 120. In this manner, air can be ejected from the through holes 106 to the retainer flange 36 held under suction on the flange holding portion 100. On an outer peripheral portion of the flange holding portion 100, an annular outer recessed portion 98a is formed by the bottom portion and an outer peripheral wall 98b of the frame body 98 and an outer peripheral side portion of the flange holding portion 100. In the outer recessed portion 98a, a non-contact suction portion 124 is arranged. The non-contact suction portion 124 is an annular component formed of metal or the like.

The non-contact suction portion 124 includes an annular raised portion 124a protruding toward the opening portion of the frame body 98 to such an extent that the annular raised portion 124a does not protrude more than the opening of the flange holding portion 100. In an outer peripheral side surface 124b of the annular raised portion 124a, a plurality of openings 124c is formed. In the present embodiment, eight openings 124c are formed at substantially equal intervals along a peripheral direction of the annular raised portion 124a, but the number of the openings 124c is not limited to eight. To each opening 124c, a second flow path 126 is connected at one end thereof.

The second flow path 126 is connected at the other end thereof to the air supply source 112. Between the air supply source 112 and the openings 124c, a second valve (second on/off valve) 128 is disposed. The second valve 128 is, for example, a solenoid valve the on/off of which is electrically controlled. The one end of the second flow path 126 is connected so that a flow of air passing through each opening 124c is inclined at a predetermined angle δ to make an acute angle with respect to a tangential direction to the outer peripheral side surface 124b (see FIG. 7). When the second valve 128 is brought into an open state, air is supplied to the second flow path 126.

On an outer side of the outer peripheral side surface 124b, the outer peripheral wall 98b of the frame body 98 exists with an outer recessed portion 124d of the non-contact suction portion 124 interposed therebetween. In the outer peripheral wall 98b, a plurality of notches 98c is formed. In the present embodiment, four notches 98c are formed at substantially equal intervals along a peripheral direction of the outer peripheral wall 98b, but the number of the notches 98c is not limited to four. When the second valve 128 is brought into an open state, air (fluid) is ejected from the openings 124c in a direction tilted by the predetermined angle δ with respect to the tangential direction to the outer peripheral side surface 124b. By the air ejected from the openings 124c, a swirl flow occurs in the outer recessed portion 124d.

The swirl flow moves in a spiraling pattern so as to spread outward in the radial direction of the frame body 98 as the swirl flow proceeds outward from the opening portion of the frame body 98. Upon occurrence of a swirl flow, the pressure thus lowers in the vicinity of the opening portion of the frame body 98 in accordance with Bernoulli's principle. As a result, a negative pressure occurs in the vicinity of the opening portion of the frame body 98. If the outer peripheral wall 98b is not disposed, air escapes outwardly of the frame body 98, so that a swirl flow is less likely to be formed. Compared with a case in which the outer peripheral wall 98b is not disposed, the present embodiment facilitates the formation of a swirl flow of an appropriate velocity, so that an appropriate negative pressure can be produced in the vicinity of the opening portion of the frame body 98.

On a side inner than the flange holding portion 100 in the frame body 98, a cylindrical inner recessed portion 98d is formed. The inner recessed portion 98d is formed to a position deeper than the outer recessed portion 98a, and functions as a positioning fitting portion as will be described later. At the bottom portion of the inner recessed portion 98d, a lens 132 is arranged to configure an optical system of a camera unit 130. The camera unit 130 further includes a light source (not depicted), such as light emitting diode (LED) lights that apply light to an object, and an imaging device (not depicted), such as a complementary metal oxide semiconductor (CMOS) image sensor or charge-coupled device (CCD) image sensor, that performs imaging via the optical system including the lens 132 and the like.

Here, referring back to FIG. 1 again, a description will be made about the cutting machine 2 and still other elements. On an edge portion of the opening 4b, the edge portion being on a side of the blade replacement unit 56, a rectangular temporary placing cover 134 is fixed in a pivotal fashion at one short side thereof via hinges 136. Upon cutting the workpiece 11, the temporary placing cover 134 is brought into an upright position as indicated by solid lines in FIG. 1. During replacement work of the cutting blade 34 by the blade replacement unit 56, on the other hand, the temporary placing cover 134 is brought into a lying position as indicated by two-dot chain lines in FIG. 1.

On an outer side of an edge portion of the bed 4, the edge portion being located on a side opposite to the cover member 24, a disc-shaped mount table 138 is arranged. Below the mount table 138, a rotational drive source (not depicted) such as a motor is arranged. To a central portion of a bottom surface of the mount table 138, an output shaft of the rotational drive source is connected. When the rotational drive source is operated, the mount table 138 is rotated in a predetermined direction. On an upper surface of the mount table 138, a disc-shaped blade stock board 140 is mounted.

Figure 9:
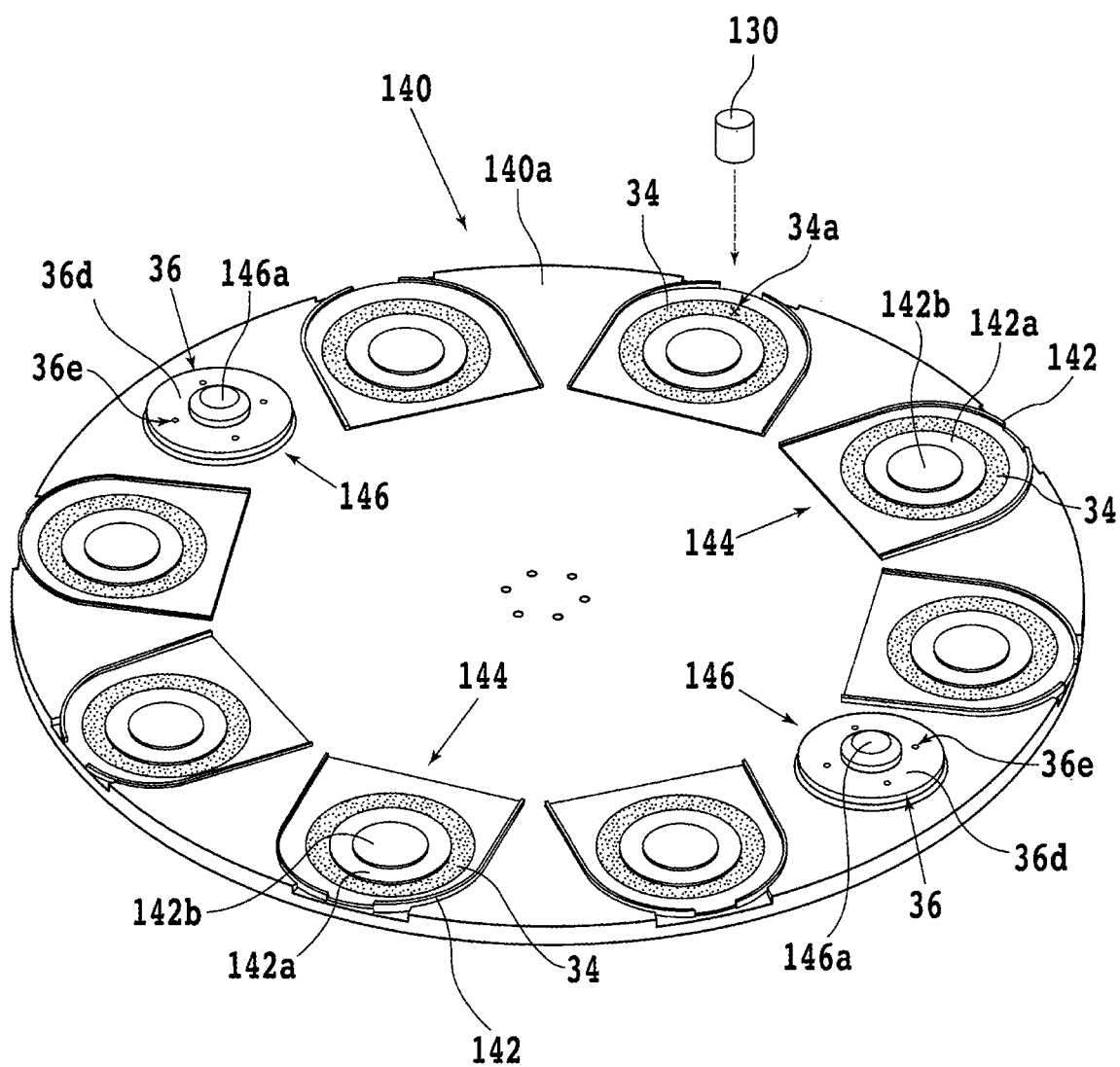
FIG. 9 is a perspective view of a blade stock board.

FIG. 9 is a perspective view of the blade stock board 140. On a side of one side 140a of the blade stock board 140, first recessed portions 144 and second recessed portions 146 are formed. In each first recessed portion 144, a blade case 142 is arranged. In each second recessed portion 146, the retainer flange 36 is arranged. In the present embodiment, two second recessed portions 146 are disposed so that a center of the one side 140a is interposed between the second recessed portions 146. In addition, four first recessed portions 144 are disposed along a peripheral direction of the one side 140a in each of one semicircular region and the other semicircular region between the two second recessed portions 146.

It is to be noted that the numbers of the first recessed portions 144 and second recessed portions 146 are not limited to the examples depicted in FIG. 9. Of a first lid and second lid configuring each resin-made blade case 142, only the second lid separated from the first lid is arranged in the corresponding first recessed portion 144. The second lid is provided with a first raised portion 142a of a rod shape. The first raised portion 142a fits in the opening of the washer-type cutting blade 34 and functions as a positioning portion that determines the position of the cutting blade 34 relative to the second lid. As a result of arrangement of the cutting blade 34 on the first raised portion 142a, the cutting blade 34 is accommodated in the blade case 142.

To at least one of two annular sides of the cutting blade 34, a mark 34a is provided. The mark 34a is provided, for example, in a form of characters, a bar code, a two-dimensional code, or the like to the cutting blade 34. The mark 34a may be printed directly on the cutting blade 34, or a sticker with the mark 34a indicated thereon may be adhered to the cutting blade 34. The mark 34a is imaged, for example, by the camera unit 130 of the above-mentioned blade replacement unit 56.

The mark 34a contains information regarding the kind of the cutting blade 34. The information includes, for example, the outer diameter, inner diameter, thickness, kind of abrasive grains, grain size of abrasive grains, kind of bond, and serial number of the cutting blade 34, identification information specifying the blade case 142 in which the cutting blade 34 is to be accommodated, and the like. It is to be noted that a mark that contains identification information specifying the cutting blade 34 to be placed in the predetermined blade case 142 may be provided in the form of characters, a bar code, a two-dimensional code, or the like to the blade case 142. Such a mark can also be imaged by the camera unit 130.

The blade stock board 140 may be formed of glass, plastic, or the like, and may be transparent at least at a part or parts thereof. If the blade stock board 140 is transparent at portions corresponding to the first recessed portions 144, the second recessed portions 146, and the like, for example, the identification information of the cutting blades 34 and blade cases 142 can be read by the camera unit 130 through the blade stock board 140. On an inner side of each first raised portion 142a, a second raised portion 142b is disposed. The second raised portion 142b protrudes more than the first raised portion 142a, and is smaller in diameter than the first raised portion 142a. The second raised portion 142b is for use in performing position matching between the retainer flange 36 and the cutting blade 34 as will be mentioned later.

Each second recessed portion 146 is provided with a rod-shaped third raised portion (raised portion) 146a. The third raised portion 146a extends through the through opening 36b of the retainer flange 36, thereby determining the position of the retainer flange 36. In the second recessed portion 146, the retainer flange 36 is placed so that the flange surface 36c is supported on the bottom portion of the second recessed portion 146 and the annular surface 36d is exposed. It is to be noted that the third raised portion 146a may be provided with a mark that contains identification information specifying the retainer flange 36 to be placed in the second recessed portion 146, in a form of characters, a bar code, a two-dimensional code, or the like. Such a mark can also be imaged by the camera unit 130.

The blade stock board 140 may also be provided with a third recessed portion (not depicted) where a rectangular dressing board is to be placed. The third recessed portion has a rectangular opening in top plan view of the blade stock board 140. The dressing board may be provided with a mark in a form of characters, a bar code, a two-dimensional code or the like, the mark including such information as the kind of abrasive grains, the grain size of abrasive grains, the concentration, the kind of bond, the serial number, and the like. It is to be noted that a mark that contains identification information specifying the dressing board to be placed in the third recessed portion may also be provided to the third recessed portion.

FIG. 9 depicts the case in which only the second lids of the blade cases 142 are placed. As an alternative, each second lid which is to be placed down and the corresponding first lid which is to be placed above the second lid so as to cover the second lid may be placed as a set in the first recessed portion 144. If this is the case, an engaging portion (not depicted) such as a claw that comes into engagement with the second lid is formed at a part of an outer peripheral portion of the first lid. A connecting member (not depicted) such as an adhesive tape is adhered to another part of the outer peripheral portion of the first lid which is located on a side opposite to the engaging portion with respect to the center of the first lid.

The first lid is connected to a part of an outer peripheral portion of the second lid via the connecting member. The resulting connected portion functions as a hinge portion for the first lid and second lid, so that the first lid and the second lid are opened and closed with the connected portion as a fulcrum. The set of the first lid and the second lid is placed so that the engaging portion is located on an outer periphery side of the one side 140a and the connected portion is located on a side of the center of the one side 140a. It is to be noted that a through opening (not depicted) is formed in a portion of a bottom wall of the first recessed portion 144 to enable a disc-shaped suction pad (not depicted) to move forward and backward.

Below the through opening, a suction mechanism (not depicted) including the suction pad that holds a lower surface of the second lid under suction is disposed. In the vicinity of the suction mechanism, a push-up mechanism (not depicted) is also arranged to push up the engaging portion of the first lid from below so that the engagement of the first lid is released. In the vicinity of the push-up mechanism and on an outer peripheral portion of the one side 140a, a press mechanism (not depicted) is disposed. The press mechanism has a pressor pin extendable along a radial direction of the one side 140a. The press mechanism causes the pressor pin to extend toward the center of the one side 140a, whereby the first lid is pressed at an inner side thereof and is opened with the connected portion as the fulcrum.

In the vicinity of the center of the one side 140a, a bar member (not depicted) is arranged substantially parallel to the one side 140a. The bar member is movable forward and backward along the radial direction of the one side 140a. To one end of the bar member, a pair of roller portions (not depicted) is connected. The bar member is used when closing the first lid. Described specifically, responsive to a movement of the bar member toward an outer periphery of the one side 140a, the first lid is pressed at an outer side thereof by the paired roller portions, so that the first lid is closed with the connected portion as the fulcrum. By performing the opening and closing of the blade case 142 with the use of the suction mechanism, the push-up mechanism, the press mechanism, and the bar member as described above, the blade case 142 can be automatically opened and closed on the side of the cutting machine 2 at the time of replacement work while protecting the cutting blade 34 in normal cases.

Referring back to FIG. 1 again, a description will be made about even still other elements of the cutting machine 2. Operations of the elevator 6, the guide rails 14, the rotational drive source and X-axis moving mechanism for the chuck table 20, the cutting units 26, the first transfer unit 52, the second transfer unit 54, the blade replacement unit 56, the mount table 138, and the like are controlled by a control unit 150. The control unit 150 includes a computer, which includes, for example, a processing apparatus such as a processor represented by a central processing unit (CPU), a main storage apparatus such as a dynamic random access memory (DRAM), a static random access memory (SRAM), or a read only memory (ROM), and an auxiliary storage apparatus such as a flash memory, a hard disk drive, or a solid state drive.

Software is stored in the auxiliary storage apparatus. By operating the processing apparatus and the like according to the software, the functions of the control unit 150 are realized. In the auxiliary storage apparatus, a predetermined program is stored to compare the pressure measured by the above-mentioned pressure measuring meter 118 with a predetermined pressure. This predetermined program functions as a suction determination section 152a. The suction determination section 152a monitors the negative pressure (gauge pressure) measured by the pressure measuring meter 118. In addition, the suction determination section 152a also compares the gauge pressure measured by the pressure measuring meter 118 with a predetermined pressure.

Described specifically, the suction determination section 152a compares the gauge pressure measured by the pressure measuring meter 118 with a predetermined first gauge pressure (first pressure) and a second gauge pressure (second pressure) of a greater value than the first gauge pressure. By doing so, the suction determination section 152a determines the success or failure of suction of a suction target on the blade holding jig 78. It is to be noted that the magnitudes of the first gauge pressure and the second gauge pressure are adjusted as needed depending on the size of the through holes 36e and the performance of the suction source such as the ejector 116.

In the auxiliary storage apparatus, another program is also stored to decode various marks such as the mark 34a imaged by the above-mentioned camera unit 130. This program functions as a mark reading section 152b for reading information contained in the various marks. The information read by the mark reading section 152b is displayed on a display apparatus (not depicted) such as a liquid crystal display or a touch panel. The display apparatus is arranged, for example, on one side wall of a housing (not depicted) enclosing the bed 4.

Figure 11:
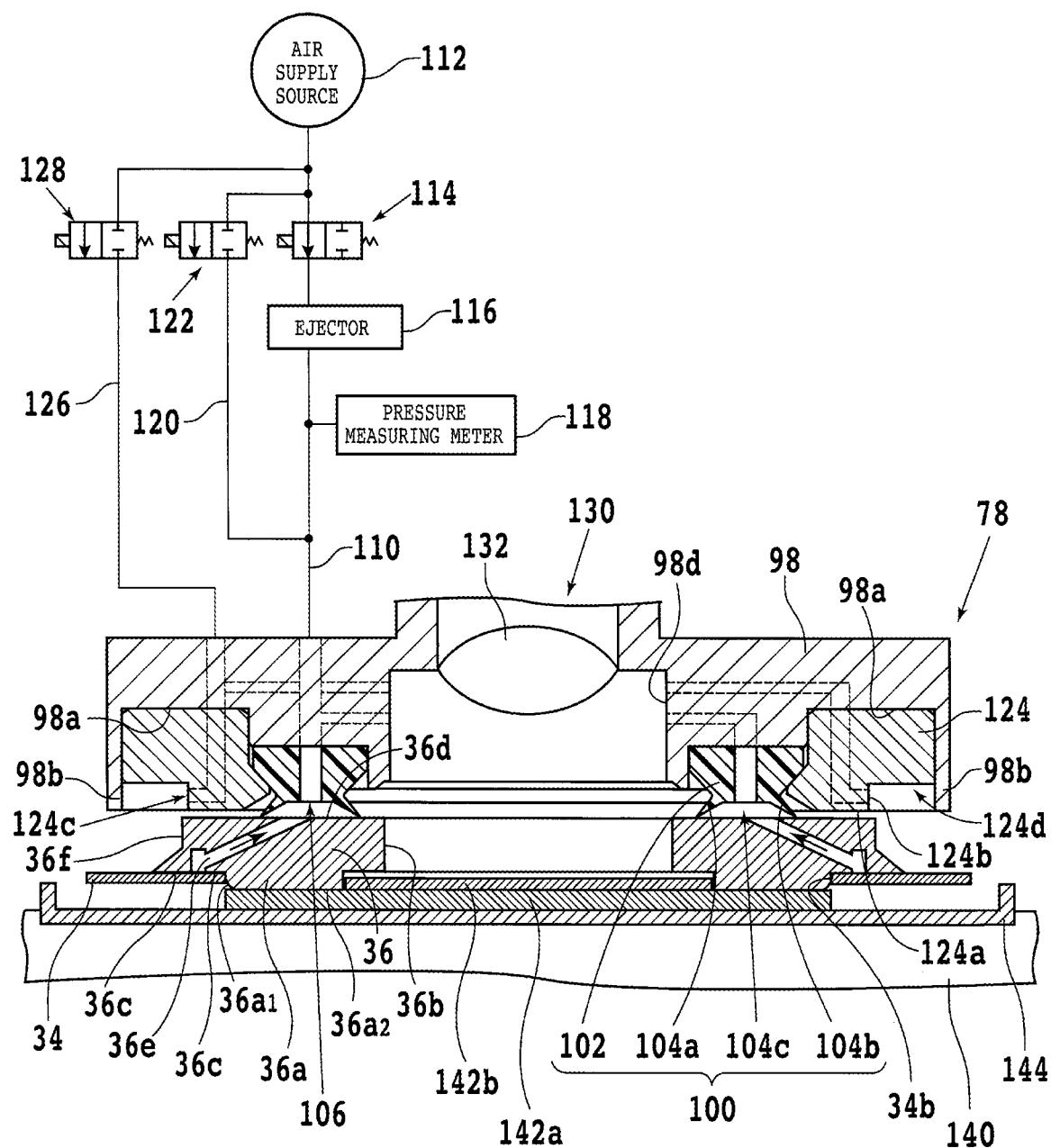
FIG. 11 is a view illustrating a cutting blade holding step.
Figure 12:
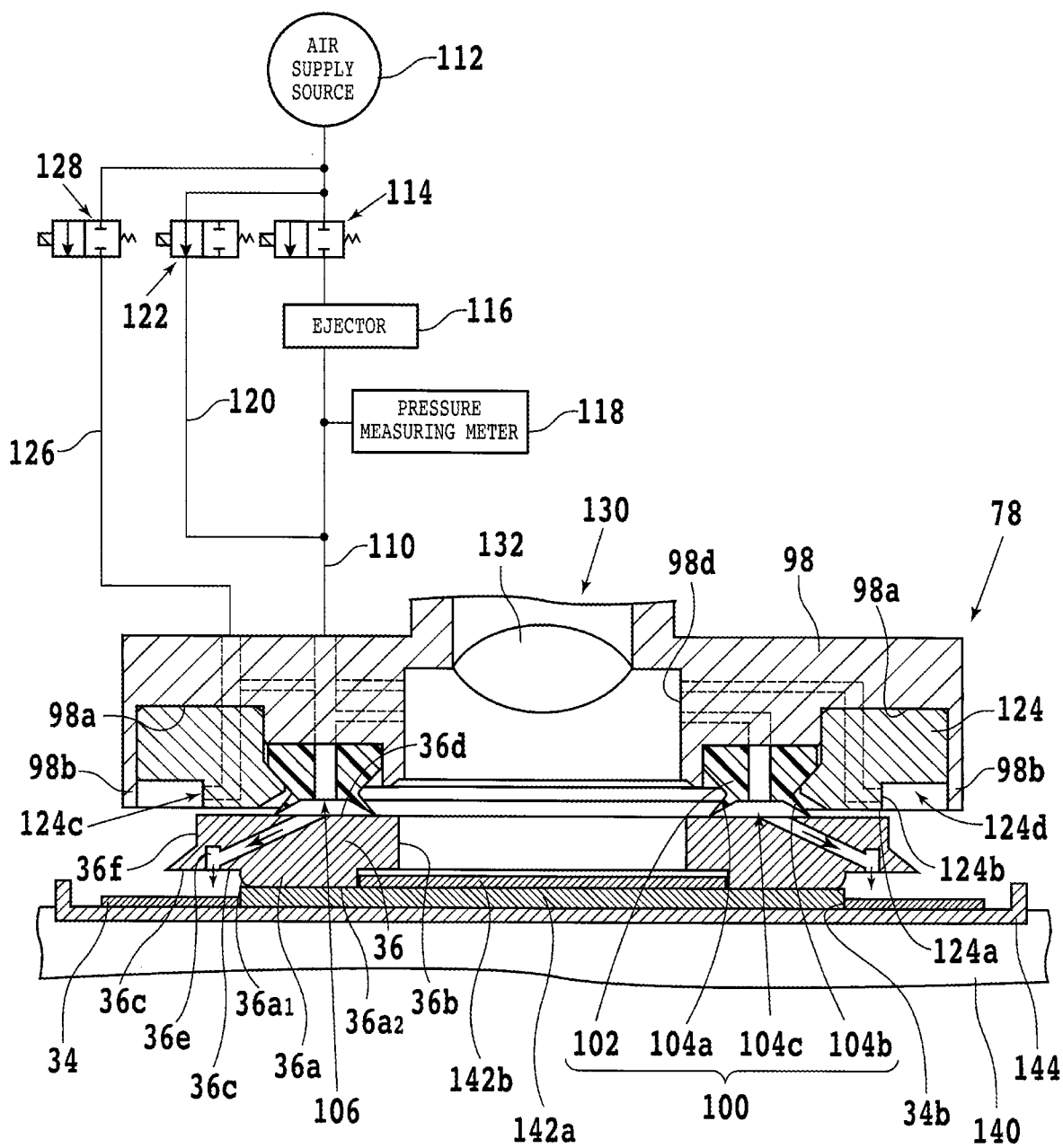
FIG. 12 is a view illustrating how to detach the cutting blade.
Figure 13:
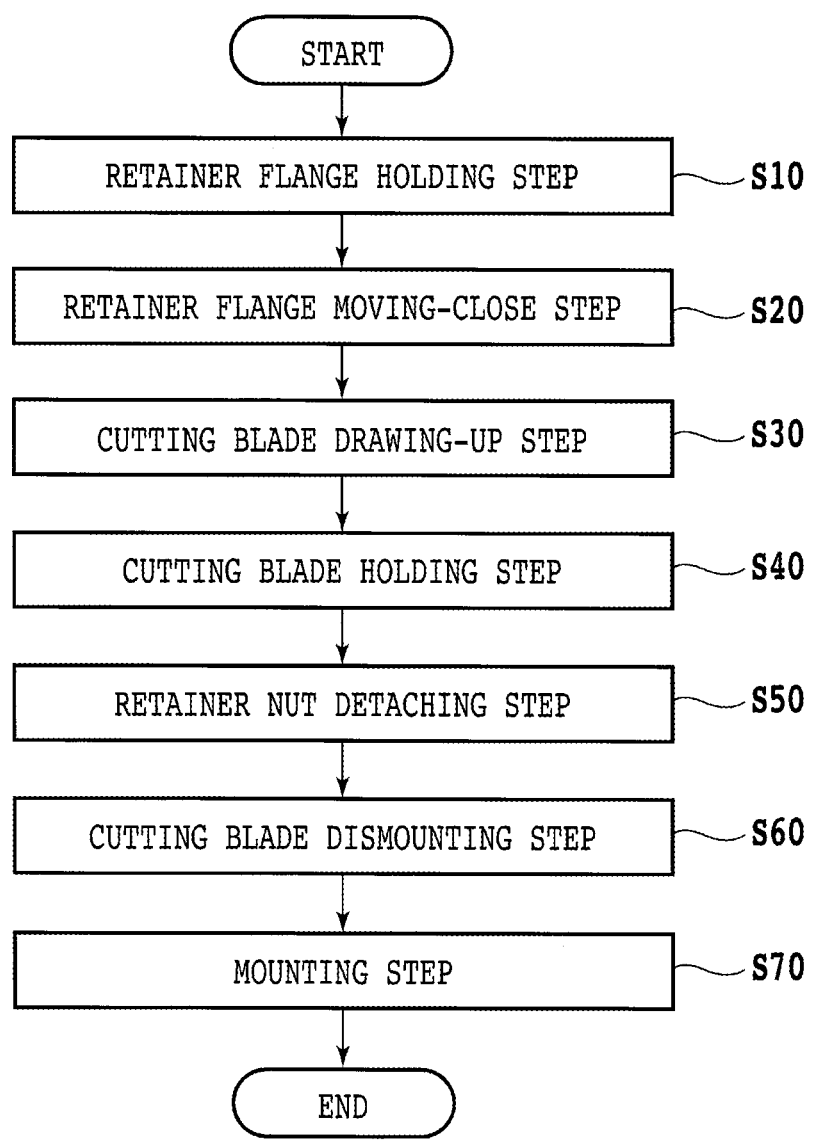
FIG. 13 is a flow diagram of a mounting method of the cutting blade.

Referring to FIG. 8, FIGS. 10 to 13, and the like, a description will next be made about a method for mounting the cutting blade 34 on the receiver flange 32 with the use of the blade replacement unit 56. FIG. 13 is a flow diagram of the mounting method of the cutting blade 34. First, the temporary placing cover 134 is assumed to be in the lying position as indicated by the two-dot chain lines in FIG. 1. Next, as depicted in FIG. 5, the first arm 66 and the like of the blade replacement unit 56 are expanded. Subsequently, as depicted in FIG. 8, one of the blade holding jigs 78 is brought to face one of the retainer flanges 36 on the blade stock board 140.

The replacement apparatus 76 is then lowered to bring the inner recessed portion 98d into fitting engagement with the third raised portion 146a. In the present embodiment, the inner recessed portion 98d functions as the positioning fitting portion, and thus the flange holding portion 100 can smoothly be arranged on the annular surface 36d. The first valve 114 is next brought into an open state, and by a negative pressure produced by the ejector 116, the annular surface 36d of the retainer flange 36 is held under suction on the flange holding portion 100 (retainer flange holding step S10) (see FIG. 8).

When the retainer flange 36 is sucked on the flange holding portion 100, the flow rate of air into the flange holding portion 100 decreases, so that the magnitude of a negative pressure measured by the pressure measuring meter 118 exceeds the magnitude of a predetermined first gauge pressure (for example, −0.005 MPa). For example, the negative pressure measured by the pressure measuring meter 118 is −0.011 MPa, so that the magnitude of the negative pressure exceeds the magnitude of the first gauge pressure. In this case, the suction determination section 152a determines that the retainer flange 36 has been held under suction on the flange holding portion 100.

After the retainer flange holding step S10, the replacement apparatus 76 is moved in a horizontal direction, and the flange surface 36c of the retainer flange 36 held under suction is moved close to one of the cutting blades 34 mounted on the blade stock board 140. It is to be noted that, at this time, the above-mentioned mark 34a may be imaged by the camera unit 130 and the information contained in the mark 34a may then be read by the mark reading section 152b. Next, the replacement apparatus 76 is lowered. The distance between the flange surface 36c and the cutting blade 34 is then decreased to a predetermined length or less (retainer flange moving-close step S20). For example, the surface $36a_2$ of the retainer flange 36 is brought into contact with an upper surface of the first raised portion 142a. After the retainer flange moving-close step S20, the second valve 128 is brought into an open state with the first valve 114 maintained in the open state, whereby air (fluid) is ejected from the individual openings 124c toward an outer peripheral portion 36f of the retainer flange 36.

Figure 10:
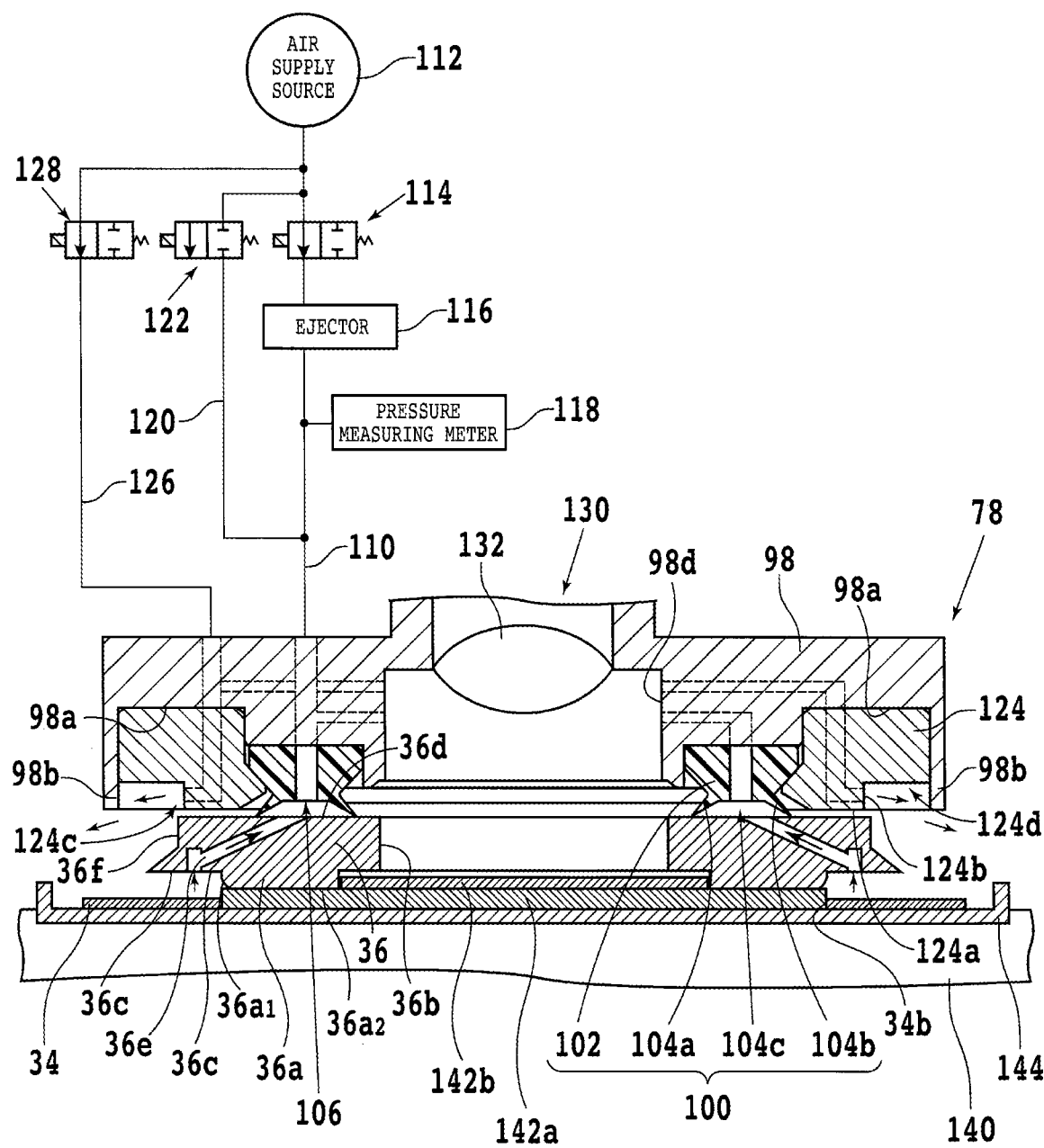
FIG. 10 is a view illustrating a cutting blade drawing-up step.

By a swirl flow of air produced around the outer peripheral portion 36f, a negative pressure occurs, so that the cutting blade 34 is sucked upward toward the flange surface 36c and is drawn up onto the flange surface 36c (cutting blade drawing-up step S30). FIG. 10 is a view illustrating the cutting blade drawing-up step S30. After the cutting blade drawing-up step S30, the second valve 128 is brought into a closed state with the first valve 114 maintained in the open state.

As a result, the cutting blade 34 which has moved close to the flange surface 36c is held on the flange surface 36c with the cutting blade 34 maintained in contact with the flange surface 36c by a suction force acting from the through holes 36e (cutting blade holding step S40). FIG. 11 is a view illustrating the cutting blade holding step S40. In the cutting blade holding step S40, the cutting blade 34 is held under suction on the blade holding jig 78 via the retainer flange 36. The retainer flange 36 and the blade holding jig 78 hence function as a holding unit that holds the cutting blade 34 under suction.

In the present embodiment, the cutting blade 34 is not pressed by a blade replacement jig via the retainer flange 36 when being held under suction, thereby enabling reduction of the risk of damaging the cutting blade 34 by pressing. In addition, in the cutting blade holding step S40, the cutting blade 34 comes, at an inner peripheral portion 34b thereof, into contact with the outer peripheral side surface $36a_1$ of the protruding portion 36a. Therefore, the position of the cutting blade 34 can be automatically determined using the protruding portion 36a.

When the cutting blade 34 is held under suction on the flange surface 36c, the flow rate of air into the flange holding portion 100 further decreases, so that the magnitude of a negative pressure measured by the pressure measuring meter 118 exceeds the magnitude of a predetermined second gauge pressure (for example, −0.04 MPa). The negative pressure measured by the pressure measuring meter 118 is, for example, −0.055 MPa, so that the magnitude of the negative pressure exceeds the magnitude of the second gauge pressure. In this case, the suction determination section 152a determines that the cutting blade 34 has been held under suction on the retainer flange 36.

As described above, the suction determination section 152a determines, from the measurement result of the gauge pressure by the pressure measuring meter 118, whether or not the cutting blade 34 is sucked on the flange surface 36c, in addition to whether or not the retainer flange 36 is sucked on the flange holding portion 100. After the cutting blade holding step S40, the second arm 70 is inserted into the door portion 50 which is in an open state, whereby the nut holding portion 80 of the replacement apparatus 76 is brought to face the retainer nut 42 of the cutting unit 26.

Subsequent to the fitting insertion of the pins 84 into the holes 42c, the individual pawls 90 are brought, at the distal end portions thereof, into engagement with the annular groove 42b of the retainer nut 42 to hold the retainer nut 42. In this state, the nut holding portion 80 is rotated in the predetermined direction to detach the retainer nut 42 from the receiver flange 32 (retainer nut detaching step S50). After the retainer nut detaching step S50, the housing 76a is rotated over 90 degrees about the rotation axis 76b, so that the other blade holding jig 78 that does not hold any cutting blade 34 is brought to face the cutting blade 34 of the cutting unit 26 from which the retainer nut 42 has been detached. By the other blade holding jig 78, the retainer flange 36 and the cutting blade 34 that have been mounted on the spindle 30 are sucked and held. As a result, the cutting blade 34 and the like are dismounted from the spindle 30 (cutting blade dismounting step S60).

Subsequently, the housing 76a is rotated again, thereby bringing the one blade holding jig 78 to face the receiver flange 32. Then, the first valve 114 is brought into a closed state and the bypass flow path valve 122 is brought into an open state, whereby air is ejected from the flange holding portion 100 to the cutting blade 34 and the retainer flange 36. As a result, the cutting blade 34 and the retainer flange 36 are caused to move apart toward the receiver flange 32. At this time, the first flow path 110, the bypass flow path 120, the bypass flow path valve 122, the flange holding portion 100, and the like function as an ejection unit that ejects air.

The internal threads 42a of the retainer nut 42 held by the nut holding portion 80 are then brought into engagement with external threads on the outer peripheral portion of the third boss portion 32e, and the retainer nut 42 is rotated in a direction opposite to the predetermined direction to fasten the retainer nut 42 on the receiver flange 32. As a result, the cutting blade 34 and the retainer flange 36 are mounted on the receiver flange 32 so that the cutting blade 34 is held between the receiver flange 32 and the retainer flange 36 (mounting step S70).

The used cutting blade 34 taken out of the cutting unit 26 is returned to the blade stock board 140. Specifically, the other blade holding jig 78 is positioned over the empty blade case 142, and the inner periphery side surface of the protruding portion 36a is fitted on the second raised portion 142b. At this time, the blade case 142 to which the cutting blade 34 is to be returned may be specified using the camera unit 130 and its associated elements. After the protruding portion 36a is brought into fitting engagement with the second raised portion 142b, the cutting blade 34 is detached.

FIG. 12 is a view illustrating how to detach the cutting blade 34. As cutting water such as pure water still remains stuck on the used cutting blade 34, the used cutting blade 34 can hardly be detached if the first valve 114 is simply brought into a closed state. Thus, the bypass flow path valve 122 is brought into an open state, and air (fluid) is ejected from the flange holding portion 100 to the cutting blade 34. Here again, the flange holding portion 100 and the like also function as the above-mentioned ejection unit. By the ejection of air from the flange holding portion 100, the cutting blade 34 can be detached from the flange holding portion 100 even if the cutting blade 34 is wet with cutting water. The detached cutting blade 34 separates from the retainer flange 36, and moves to the outer peripheral portion of the first raised portion 142a. Next, if the retainer flange 36 is to be separated from the blade holding jig 78, the first valve 114 is again brought into an open state, whereby the retainer flange 36 is held under suction and is arranged over the empty second recessed portion 146. Air is then ejected, so that the retainer flange 36 is separated from the flange holding portion 100.

Figure 14:
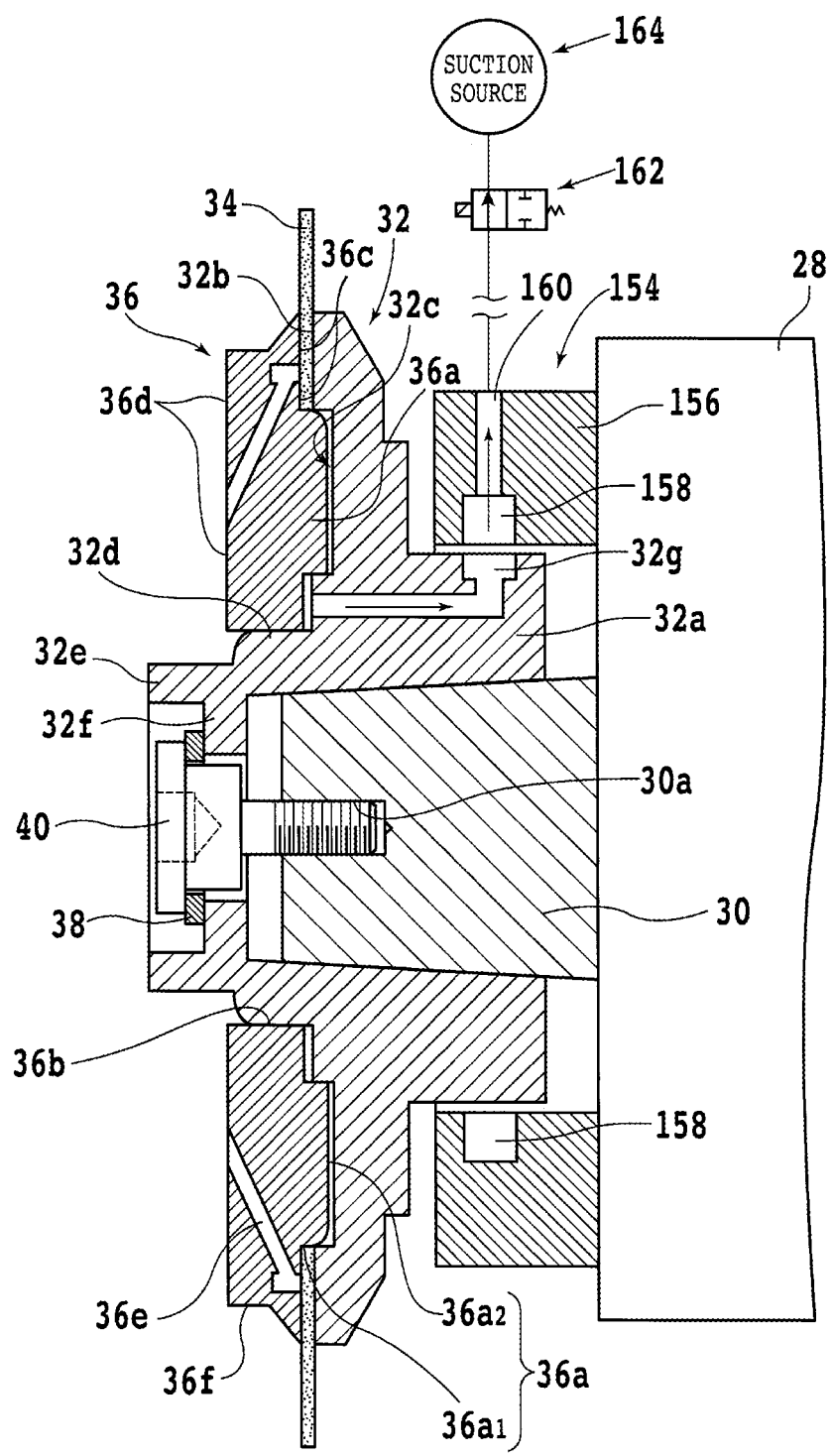
FIG. 14 is a fragmentary cross-sectional side view depicting a modification of the cutting unit.

Next, a description will be made about a modification of the cutting unit 26. FIG. 14 is a fragmentary cross-sectional side view depicting the modification of the cutting unit 26. A cutting unit 26 according to the modification has a rotary joint 154 fixed on a distal end portion of the spindle housing 28. The rotary joint 154 has a cylindrical boss portion 156. In an inner peripheral portion of the boss portion 156, an annular groove 158 is formed. A cylindrical suction channel 160 is formed through a top portion of the boss portion 156 at a position corresponding to the annular groove 158. The suction channel 160 is connected to a suction source 164 such as an ejector via a solenoid valve 162.

Through the receiver flange 32, a communication channel 32g is formed. One end of the communication channel 32g is formed in an outer peripheral surface of the first boss portion 32a. The one end of the communication channel 32g always faces the annular groove 158 even when the receiver flange 32 rotates. A negative pressure thus acts on the communication channel 32g whenever the solenoid valve 162 is brought into an open state. The other end of the communication channel 32g is located on a side inner than the recessed portion 32c and is located on a side outer than the second boss portion 32d, both in a radial direction of the receiver flange 32. The other end of the communication channel 32g is an opening opposing the retainer flange 36.

When the solenoid valve 162 is brought into an open state, a negative pressure acts on the other end of the communication channel 32g, and the retainer flange 36 is held under suction on the receiver flange 32 by the negative pressure. In this modification, the retainer flange 36 is held under suction by the negative pressure as described above, so that the retainer nut 42 can be omitted. Further, the external threads of the third boss portion 32e of the receiver flange 32 can also be omitted. In addition, the nut holding portion 80 can be omitted in the replacement apparatus 76. Therefore, the cutting unit 26 according to this modification has such advantages, that compared with the first embodiment, the replacement apparatus 76 can be simplified in configuration and can also be downsized.

Figure 15:
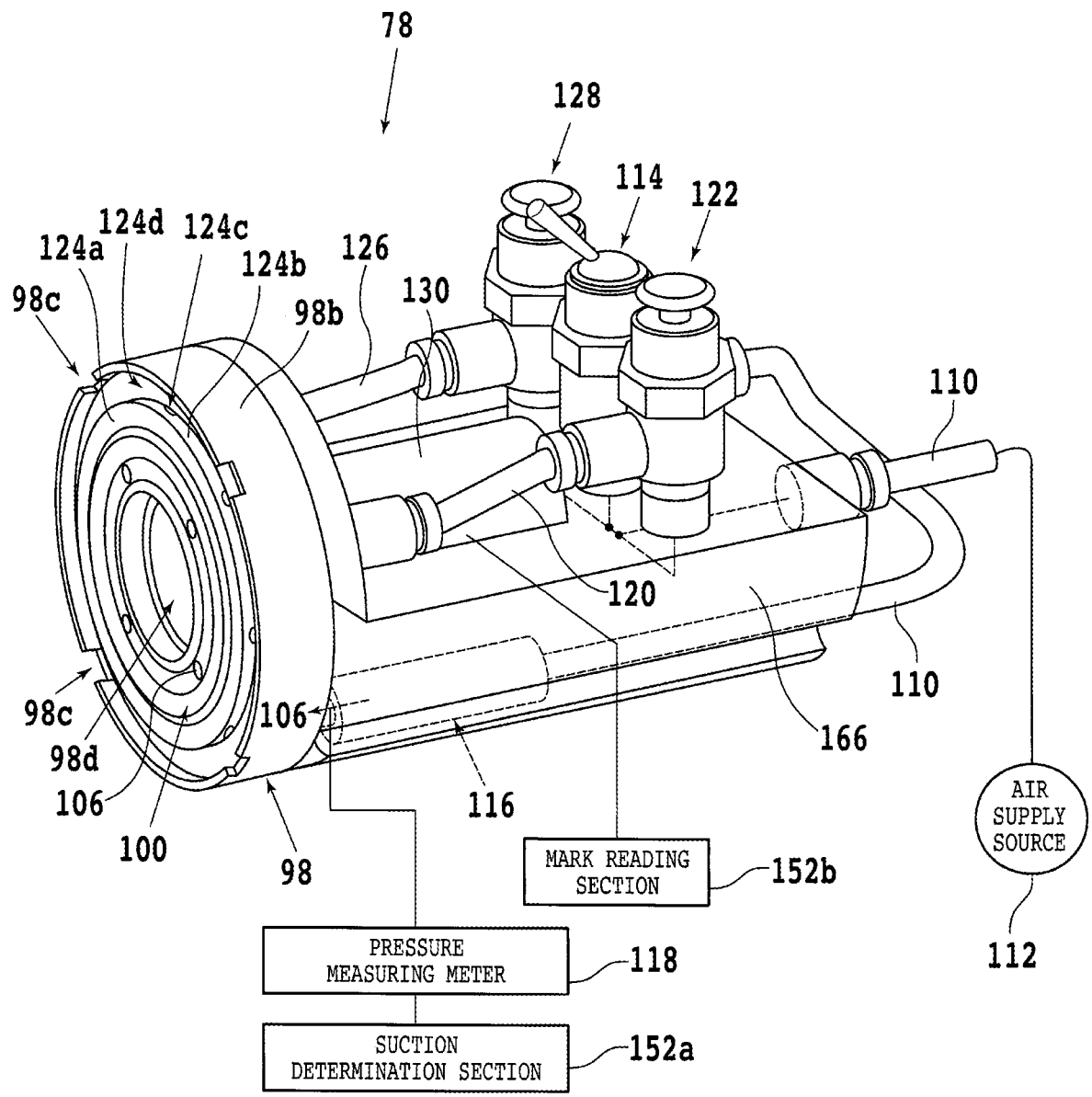
FIG. 15 is a perspective view of the blade holding jig as viewed from its front side.
Figure 16:
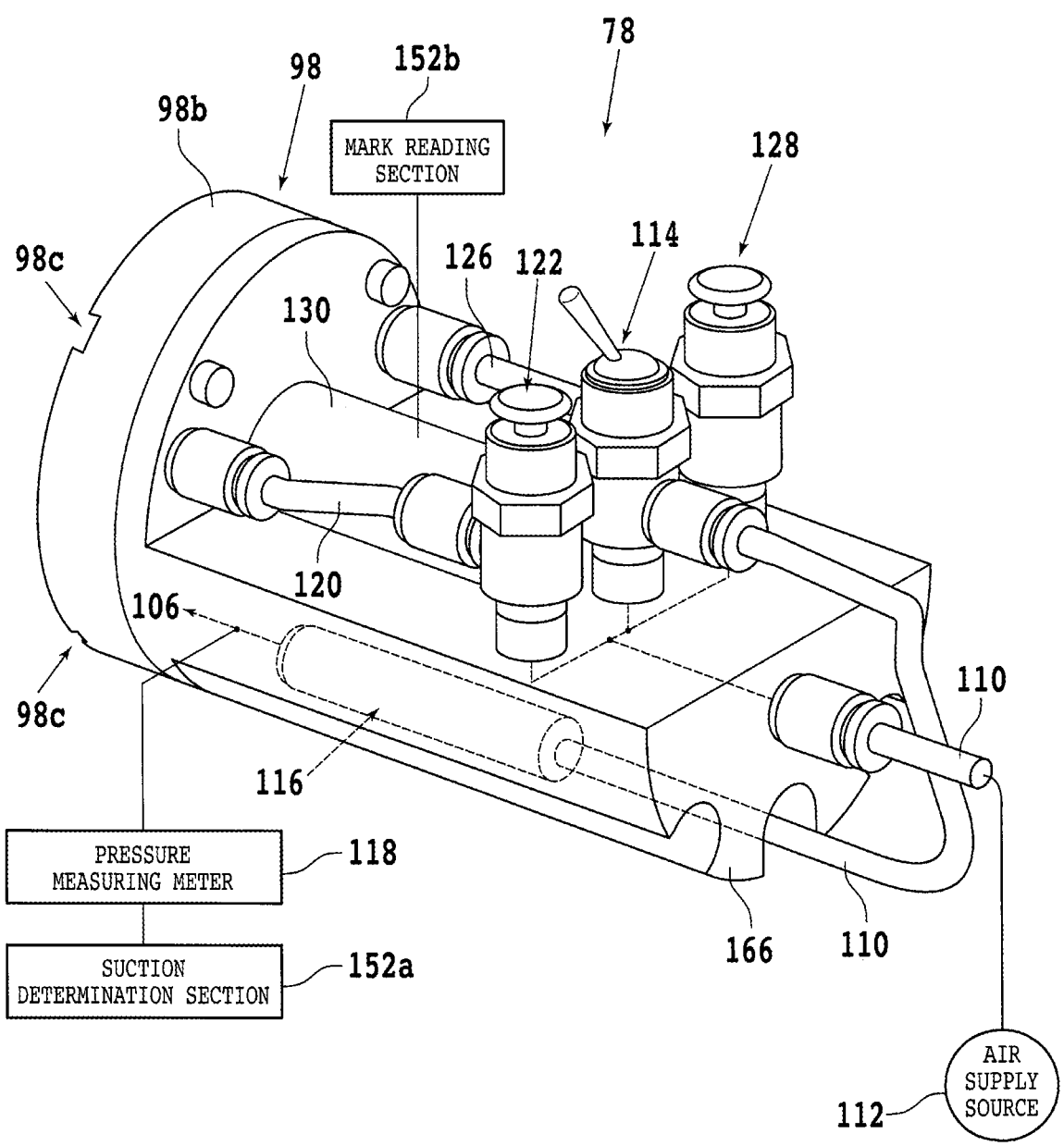
FIG. 16 is a perspective view of the blade holding jig as viewed from its back side.

Next, a description will be made about a modification of the replacement apparatus 76. In this modification, the blade holding jig 78 is not moved by a moving unit such as the lift mechanism 60. In this modification, the blade holding jig 78 is mounted on the cutting machine 2 so that an operator can move the blade holding jig 78 by holding it with the hand. FIG. 15 is a perspective view of the blade holding jig 78 as viewed from its front side, and FIG. 16 is a perspective view of the blade holding jig 78 as viewed from its back side. The blade holding jig 78 has a semicylindrical base portion 166. It is to be noted that, in FIGS. 15 and 16, some of the elements are illustrated as functional blocks and flow paths of fluid, wiring, and the like are simplified and are indicated by lines.

The base portion 166 functions, for example, as a handheld portion when the operator holds the blade holding jig 78. To a side of one end of the base portion 166, the frame body 98 that includes the flange holding portion 100, the non-contact suction portion 124, and the like is connected. In a bottom part of the base portion 166, the ejector 116 is accommodated. To the first flow path 110 between the ejector 116 and the through hole 106, the pressure measuring meter 118 is connected. The pressure measuring meter 118 in this modification is mounted on the blade holding jig 78. To the pressure measuring meter 118, the suction determination section 152a is connected.

The pressure measuring meter 118 and the suction determination section 152a are mounted, for example, on the base portion 166, but may also be arranged at a desired location between the base portion 166 and the cover member (not depicted) that encloses the base portion 166. The suction determination section 152a includes, for example, an integrated circuit such as an application specific integrated circuit (ASIC). To the suction determination section 152a, one or more LED lights (not depicted) may be connected. The suction determination section 152a may be arranged on a side wall of the cover member, and may activate the one or more LED lights depending on the success or failure of suction of the retainer flange 36 and the cutting blade 34.

On the base portion 166, the camera unit 130 is also mounted. In addition to the above-mentioned lens 132, the imaging device, and the like, the mark reading section 152b is also connected to the camera unit 130 to decode imaged various marks such as the mark 34a. The mark reading section 152b is mounted, for example, on the base portion 166, but may be arranged at a desired location between the base portion 166 and the cover member enclosing the base portion 166. The mark reading section 152b includes, for example, an integrated circuit such as an ASIC.

On an upper part of the base portion 166, the first valve (first on/off valve) 114, which is a manual on/off valve having a lever, is arranged so that it is exposed from the cover member. In addition, the bypass flow path valve 122 and the second valve (second on/off valve) 128, both of which are manual on/off valves having a pushbutton, are also arranged so that they are exposed from the cover member. If the cutting blade 34 is to be replaced by using the blade holding jig 78 depicted in FIGS. 15 and 16, the operator first detaches the retainer nut 42 manually (retainer nut detaching step S4).

Next, the blade holding jig 78 is inserted into the cover member 24 through the door portion 50. By the blade holding jig 78, the cutting blade 34 and the retainer flange 36 are held under suction and then dismounted from the spindle 30 (cutting blade dismounting step S8). The blade holding jig 78 is next positioned on the blade stock board 140. Air is then ejected from the flange holding portion 100, whereby the cutting blade 34 is separated from the flange holding portion 100 and is arranged in the empty blade case 142.

Subsequently, if the retainer flange 36 is to be used as it is, the cutting blade drawing-up step S30 and the cutting blade holding step S40 are sequentially performed after the retainer flange moving-close step S20. It is to be noted that if the retainer flange 36 that has been mounted on the spindle 30 is to be replaced by a new retainer flange 36, S20 to S40 are sequentially performed after the retainer flange holding step S10.

Then, the first valve 114 is brought into a closed state and the bypass flow path valve 122 is brought into an open state, whereby air is ejected from the flange holding portion 100 to the cutting blade 34 and the retainer flange 36. As a result, the cutting blade 34 and the retainer flange 36 separate toward the receiver flange 32. Finally, the operator fastens the retainer nut 42 on the receiver flange 32, whereby the cutting blade 34 and the like are secured to the receiver flange 32 (mounting step S70).

Figure 17:
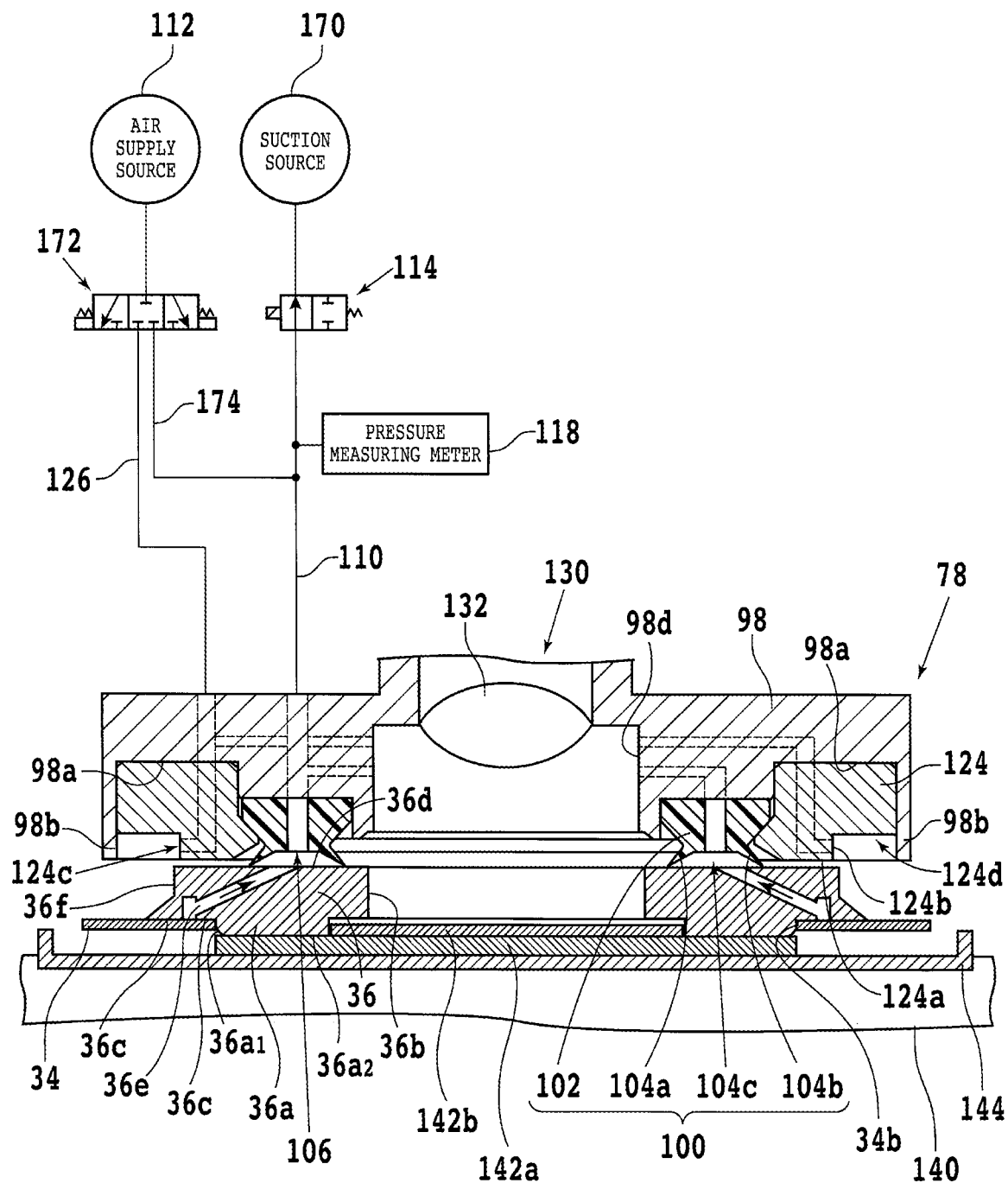
FIG. 17 is a fragmentary cross-sectional side view of a blade holding jig and some associated elements according to a second embodiment.
Figure 18:
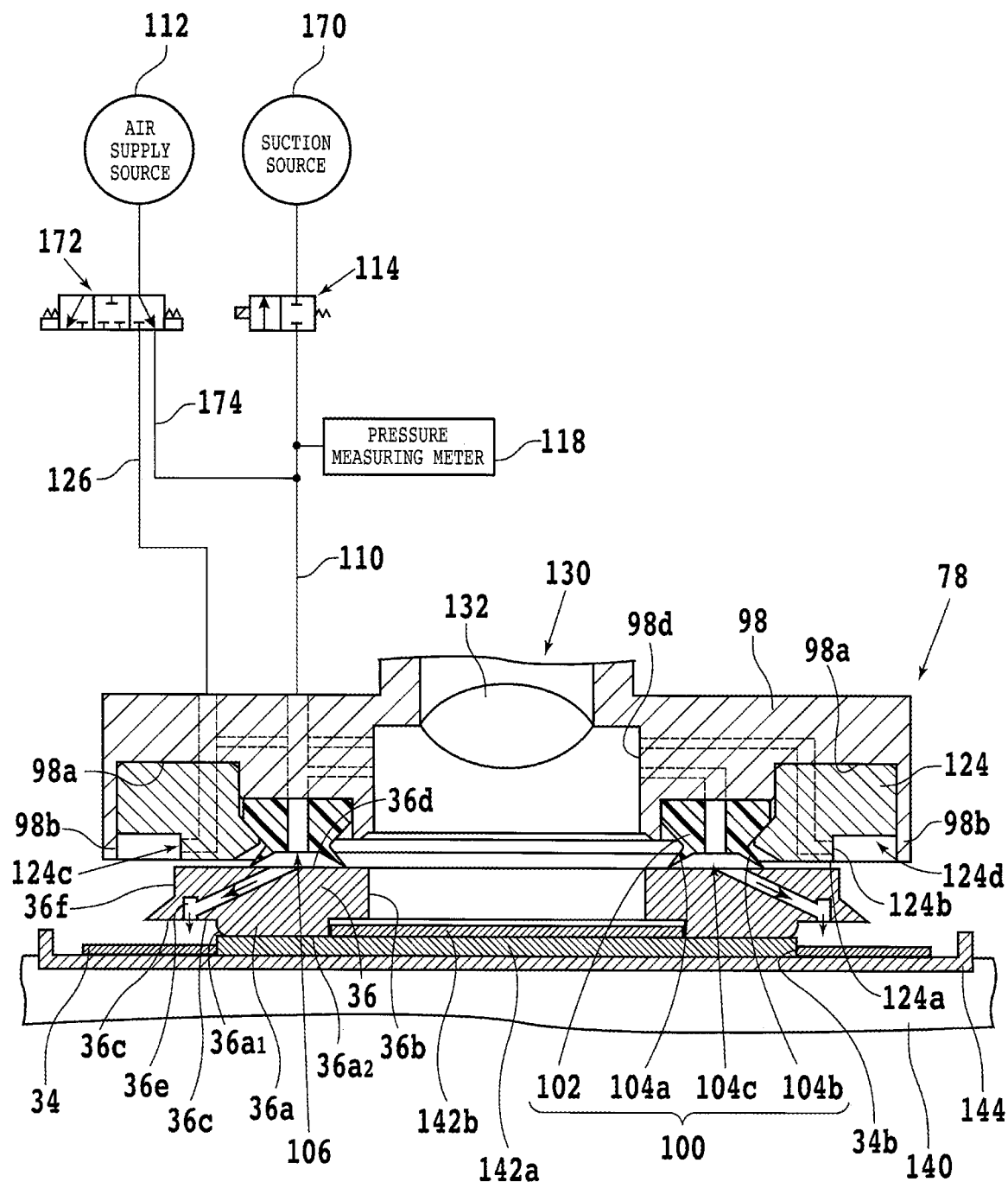
FIG. 18 is a view illustrating how to detach the cutting blade.

With reference to FIGS. 17 and 18, a description will next be made about a second embodiment. Differences from the blade holding jig 78 of the first embodiment will hereinafter be described primarily. FIG. 17 is a fragmentary cross-sectional side view of a blade holding jig 78 according to the second embodiment and some associated elements. In the first flow path 110, a suction source 170 such as a vacuum pump or an ejector is arranged on a side opposite to the through hole 106 with respect to the first valve 114. If the first valve 114 is brought into an open state, a negative pressure is caused to act on the through hole 106, so that the annular surface 36d of the retainer flange 36 can be held under suction on the flange holding portion 100.

In the second embodiment, an electromagnetically driven, three-port valve 172 of the three-position closed center type (second on/off valve) is also connected between the second flow path 126 and the air supply source 112. The three-port valve 172 has two output ports. To one of the two output ports, the second flow path 126 is connected. To the other output port, on the other hand, a connection flow path 174 is connected at one end thereof. It is to be noted that the other end of the connection flow path 174 is connected to the first flow path 110.

To an input port of the three-port valve 172, the air supply source 112 is connected. The three-port valve 172 is controlled to one of a first open state in which air from the air supply source 112 is outputted to the second flow path 126, a second open state in which the air is outputted to the connection flow path 174, and a closed state in which the air is outputted neither to the second flow path 126 nor the connection flow path 174. The ejector 116 described in the first embodiment is not mounted on the blade holding jig 78 of the second embodiment, and the air supply source 112 is arranged outside the blade holding jig 78. Therefore, the blade holding jig 78 of the second embodiment has such an advantage that it can be downsized.

The first valve 114, the pressure measuring meter 118, the three-port valve 172, and the like may be disposed outside the replacement apparatus 76, or may be mounted integrally with the frame body 98 on the blade holding jig 78. In the retainer flange holding step S10 using the blade holding jig 78 of the second embodiment, the three-port valve 172 is controlled beforehand to remain in the closed state depicted in FIG. 17, and the first valve 114 is then brought into an open state. As a result, the retainer flange 36 is held under suction on the flange holding portion 100.

In the cutting blade drawing-up step S30 after the retainer flange moving-close step S20, the first valve 114 is brought into an open state beforehand, and the three-port valve 172 is then brought into a first open state. As a result, a swirl flow occurs by air ejected from the openings 124c. By this swirl flow, a negative pressure is produced in the non-contact suction portion 124, so that the cutting blade 34 is drawn up onto the flange surface 36c. Further, with the first valve 114 maintained in the open state, the three-port valve 172 is brought into a closed state. As a result, the cutting blade 34 is held under suction on the flange surface 36c (cutting blade holding step S40) (see FIG. 17).

When air is to be ejected from the through holes 36e after the mounting step S70, on the other hand, the first valve 114 is brought into a closed state beforehand, and the three-port valve 172 is then brought into a second open state. As a result, air is ejected from the flange holding portion 100. At this time, the flange holding portion 100, the first flow path 110, the three-port valve 172, the connection flow path 174, and the like function as an ejection unit. FIG. 18 is a view illustrating how to detach the cutting blade 34. As described above, the cutting blade 34 can be separated from the retainer flange 36. It is to be noted that the blade holding jig 78 according to the second embodiment may also be mounted on the replacement apparatus 76 so that it is movable by the moving unit including the lift mechanism 60 as depicted, for example, in FIG. 4, or may be mounted on the cutting machine 2 so that the operator can move the blade holding jig 78 by holding it with the hand.

Figure 19:
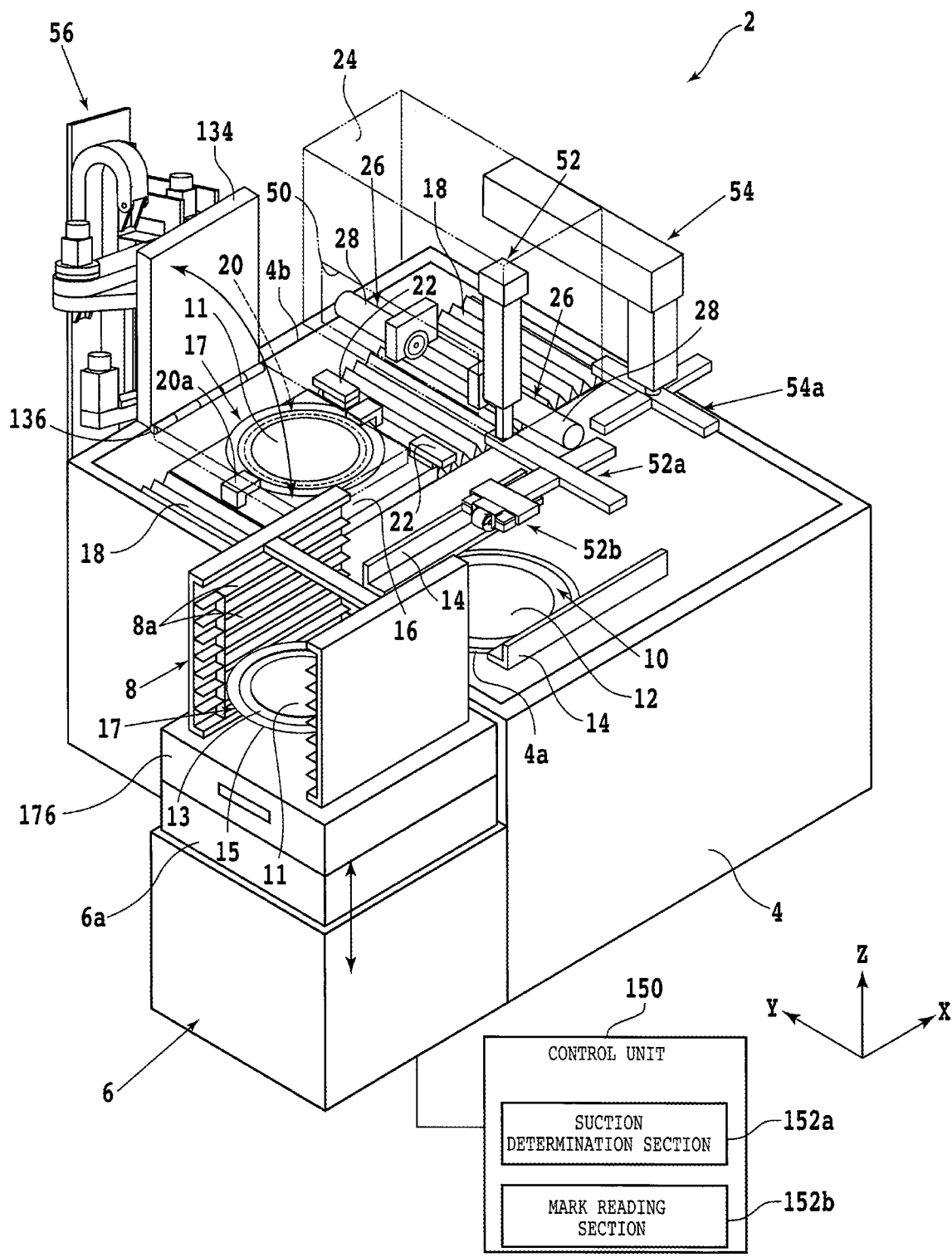
FIG. 19 is a perspective view of a cutting machine according to a third embodiment.

A description will next be made about a third embodiment. FIG. 19 is a perspective view of a cutting machine 2 according to the third embodiment. In the cutting machine 2 according to the third embodiment, a storage box 176 with the blade stock board 140 stored therein is arranged between the elevator 6 and the cassette 8. The third embodiment is different from the first embodiment in this respect. On one side of the storage box 176, the one side being the side of the cleaning unit 10, a closable door portion (not depicted) is disposed. If the blade stock board 140 is to be taken out from the storage box 176, the elevator 6 is lifted to move the storage box 176 to substantially the same height as the paired guide rails 14.

Then, the door portion (not depicted) of the storage box 176 is opened, and the blade stock board 140 is pulled out by the grip mechanism 52b of the first transfer unit 52 onto the paired guide rails 14. Thereafter, the blade stock board 140 is moved by the suction unit 52a onto the temporary placing cover 134. It is to be noted that, as a modification of the third embodiment, the blade stock board 140 may be accommodated in the cassette 8. Moreover, the structures, methods, and the like according to the above-described embodiments can be practiced with changes as needed insofar as such changes do not result in a departure from the scope of the object of the present invention. Each embodiment and its modifications may be combined with one or more other embodiments. Described specifically, the blade holding jig 78 may hold, under suction, not only the cutting blade 34 but also the dressing board. The blade holding jig 78 may hold the dressing board under suction on the flange holding portion 100, or may hold the dressing board under suction by the non-contact suction portion 124.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A blade holding jig for holding a cutting blade via an annular retainer flange to be mounted on a distal end portion of a spindle so as to hold the cutting blade in cooperation with a receiver flange fixed on the distal end portion, comprising:
    an annular flange holding portion configured to hold a first annular surface of the retainer flange under suction; and
    an annular non-contact suction portion arranged on an outer peripheral portion of the flange holding portion and configured to produce a negative pressure by ejection of a fluid toward an outer peripheral portion of the retainer flange held by the flange holding portion and to draw up the cutting blade toward the retainer flange,
    wherein the cutting blade drawn up toward the retainer flange by the non-contact suction portion is held on the retainer flange by a suction force acting from the flange holding portion via a plurality of through holes disposed through the retainer flange so as to extend from a second annular surface to the first annular surface of the retainer flange, the second annular surface being located on a side opposite to the first annular surface and in contact with one side of the cutting blade.

2. The blade holding jig according to claim 1, wherein the non-contact suction portion is configured to eject the fluid so as to produce a swirl flow of the fluid in a periphery of the outer peripheral portion of the retainer flange.

3. The blade holding jig according to claim 1, wherein the non-contact suction portion includes
    an annular raised portion, and
    a plurality of openings disposed in an outer peripheral side surface of the annular raised portion, and
    a flow path is connected to each of the openings so that the fluid is ejected at a predetermined oblique angle with respect to a tangential direction to the outer peripheral side surface.

4. The blade holding jig according to claim 1, wherein the flange holding portion includes an annular pad portion that comes into contact with the first annular surface of the retainer flange.

5. The blade holding jig according to claim 1,
    wherein a first flow path is connected via a first on/off valve to the flange holding portion and is configured to cause a negative pressure to act on the flange holding portion via the first on/off valve, and
    a second flow path is connected via a second on/off valve to the non-contact suction portion and is configured to supply the fluid to the non-contact suction portion via the second on/off valve.

6. The blade holding jig according to claim 5, further comprising:
    a pressure measuring meter that measures the negative pressure produced in the first flow path; and
    a suction determination section configured to determine through comparison between the negative pressure in the first flow path as measured by the pressure measuring meter and a first pressure whether or not the retainer flange is sucked on the flange holding portion, and through comparison between the negative pressure in the first flow path as measured by the pressure measuring meter and a second pressure greater in magnitude than the first pressure whether or not the cutting blade is sucked on the second annular surface of the retainer flange.

7. The blade holding jig according to claim 1, wherein the flange holding portion has a positioning fitting portion that fits on a cylindrical raised portion arranged so as to extend through an opening in the annular retainer flange.

8. The blade holding jig according to claim 1, further comprising:
    a camera unit configured to image a mark that is formed on the one side of the cutting blade and that contains information regarding a kind of the cutting blade; and
    a mark reading section that reads the mark imaged by the camera unit.

9. The blade holding jig according to claim 1, further comprising:
    a third flow path connected to the flange holding portion via a third on/off valve,
    wherein the cutting blade is separated from the second annular surface of the retainer flange by ejection of the fluid from the third flow path toward the cutting blade held under suction on the second annular surface of the retainer flange by the flange holding portion.

10. A cutting machine including a cutting unit in which a cutting blade is to be mounted on a receiver flange fixed on a distal end portion of a spindle, comprising:
    a blade stock board that stores the cutting blade;
    a replacement apparatus that replaces the cutting blade to be mounted on the receiver flange; and
    a moving unit that moves the replacement apparatus between a replacing position where the cutting blade is replaced and a retracted position,
    wherein the replacement apparatus has
    a blade holding jig configured to hold the cutting blade via an annular retainer flange to be mounted on the distal end portion so as to hold the cutting blade in cooperation with the receiver flange fixed on the distal end portion, a nut holding portion that holds a retainer nut to be fastened on the receiver flange, and a nut rotating portion that rotates the retainer nut, the blade holding jig includes an annular flange holding portion configured to hold a first annular surface of the retainer flange under suction, and an annular non-contact suction portion arranged on an outer peripheral portion of the flange holding portion and configured to produce a negative pressure by ejection of a fluid toward an outer peripheral portion of the retainer flange held by the flange holding portion and to draw up the cutting blade toward the retainer flange, and the cutting blade drawn up toward the retainer flange by the non-contact suction portion is held on the retainer flange by a suction force acting from the flange holding portion via a plurality of through holes disposed through the retainer flange so as to extend from a second annular surface to the first annular surface of the retainer flange, the second annular surface being located on a side opposite to the first annular surface and in contact with one side of the cutting blade.

11. A method for mounting a cutting blade on a receiver flange fixed on a distal end portion of a spindle, by using a blade holding jig, the blade holding jig including an annular flange holding portion configured to hold under suction a first annular surface of an annular retainer flange to be mounted on the distal end portion, and an annular non-contact suction portion arranged on an outer peripheral portion of the flange holding portion and configured to produce a negative pressure by ejection of a fluid toward an outer peripheral portion of the retainer flange held by the flange holding portion and to draw up the cutting blade toward the retainer flange, the retainer flange having a plurality of through holes disposed through the retainer flange so as to extend from a second annular surface to the first annular surface of the retainer flange, the second annular surface being located on a side opposite to the first annular surface and in contact with one side of the cutting blade, the method comprising:

a retainer flange holding step of holding the first annular surface of the retainer flange supported at the second annular surface thereof on the blade stock board, under suction by the flange holding portion;

a retainer flange moving-close step of moving the second annular surface of the retainer flange held under suction, close to the cutting blade mounted on the blade stock board, to decrease a distance between the second annular surface and the cutting blade to a predetermined length or less;

a cutting blade drawing-up step of, after the retainer flange moving-close step, ejecting the fluid from the non-contact suction portion to produce a negative pressure and to suck the cutting blade and drawing up the cutting blade toward the second annular surface;

a cutting blade holding step of holding the cutting blade that has come close to the second annular surface in the cutting blade drawing-up step, on the second annular surface by a suction force acting from the through holes; and a mounting step of mounting the cutting blade and the retainer flange on the receiver flange fixed on the spindle so that the cutting blade is held between the receiver flange and the retainer flange with the cutting blade held on the second annular surface of the retainer flange by the suction force.

* * * * *